United States Patent
Shen et al.

(10) Patent No.: US 9,899,281 B2
(45) Date of Patent: Feb. 20, 2018

(54) INTEGRATED CIRCUITS PROTECTED BY SUBSTRATES WITH CAVITIES, AND METHODS OF MANUFACTURE

(71) Applicant: Invensas Corporation, San Jose, CA (US)

(72) Inventors: Hong Shen, Oak Park, CA (US); Charles G. Woychik, San Jose, CA (US); Arkalgud R. Sitaram, Cupertino, CA (US)

(73) Assignee: INVENSAS CORPORATION, San Jose, CA (US)

( * ) Notice: Subject to any disclaimer, the term of this patent is extended or adjusted under 35 U.S.C. 154(b) by 0 days.

(21) Appl. No.: 15/265,148

(22) Filed: Sep. 14, 2016

(65) Prior Publication Data
US 2017/0040237 A1 Feb. 9, 2017

Related U.S. Application Data

(63) Continuation of application No. 14/214,365, filed on Mar. 14, 2014, now abandoned.
(Continued)

(51) Int. Cl.
*H01L 23/498* (2006.01)
*H01L 23/055* (2006.01)
(Continued)

(52) U.S. Cl.
CPC ........ *H01L 23/055* (2013.01); *H01L 21/2885* (2013.01); *H01L 21/4803* (2013.01);
(Continued)

(58) Field of Classification Search
CPC . H01L 23/315; H01L 21/56; H01L 21/76879; H01L 21/76897; H01L 23/04;
(Continued)

(56) References Cited

U.S. PATENT DOCUMENTS 5,532,519 A 7/1996 Bertin et al.
5,701,233 A 12/1997 Carson et al.
(Continued)

FOREIGN PATENT DOCUMENTS

EP 1418617 A2 5/2004
EP 1884994 A2 6/2008
(Continued)

OTHER PUBLICATIONS

John H. Lau, "TSV Interposer: The most Cost-Effective Integrator for 30 IC Integration," Electronics & Optoelectronics Research Laboratories, Industrial Technology Research Institute (ITRI), retrieved on Feb. 24, 2015.
(Continued)

*Primary Examiner* — Cuong B Nguyen
(74) *Attorney, Agent, or Firm* — Haynes and Boone, LLP

(57) ABSTRACT

Dies (110) with integrated circuits are attached to a wiring substrate (120), possibly an interposer, and are protected by a protective substrate (410) attached to a wiring substrate. The dies are located in cavities in the protective substrate (the dies may protrude out of the cavities). In some embodiments, each cavity surface puts pressure on the die to strengthen the mechanical attachment of the die the wiring substrate, to provide good thermal conductivity between the dies and the ambient (or a heat sink), to counteract the die warpage, and possibly reduce the vertical size. The protective substrate may or may not have its own circuitry connected to the dies or to the wiring substrate. Other features are also provided.

17 Claims, 19 Drawing Sheets

Related U.S. Application Data

(60) Provisional application No. 61/952,066, filed on Mar. 12, 2014.

(51) Int. Cl.

| | | |
|---|---|---|
| *H01L 23/31* | (2006.01) | |
| *H01L 21/56* | (2006.01) | |
| *H01L 21/288* | (2006.01) | |
| *H01L 21/768* | (2006.01) | |
| *H01L 25/065* | (2006.01) | |
| *H01L 25/00* | (2006.01) | |
| *H01L 23/04* | (2006.01) | |
| *H01L 23/14* | (2006.01) | |
| *H01L 23/367* | (2006.01) | |
| *H01L 23/00* | (2006.01) | |
| *H01L 23/48* | (2006.01) | |
| *H01L 23/538* | (2006.01) | |
| *H01L 21/48* | (2006.01) | |
| *H01L 23/10* | (2006.01) | |

(52) U.S. Cl.
CPC ............ *H01L 21/486* (2013.01); *H01L 21/56* (2013.01); *H01L 21/76879* (2013.01); *H01L 21/76897* (2013.01); *H01L 23/04* (2013.01); *H01L 23/147* (2013.01); *H01L 23/315* (2013.01); *H01L 23/3107* (2013.01); *H01L 23/3675* (2013.01); *H01L 23/481* (2013.01); *H01L 23/49827* (2013.01); *H01L 23/49838* (2013.01); *H01L 23/5389* (2013.01); *H01L 24/97* (2013.01); *H01L 25/0652* (2013.01); *H01L 25/0655* (2013.01); *H01L 25/50* (2013.01); *H01L 21/561* (2013.01); *H01L 23/10* (2013.01); *H01L 23/49816* (2013.01); *H01L 2224/16145* (2013.01); *H01L 2224/16225* (2013.01); *H01L 2224/32225* (2013.01); *H01L 2224/73204* (2013.01); *H01L 2225/06548* (2013.01); *H01L 2225/06555* (2013.01); *H01L 2924/12042* (2013.01); *H01L 2924/15311* (2013.01); *H01L 2924/181* (2013.01)

(58) Field of Classification Search
CPC ............... H01L 23/147; H01L 23/3107; H01L 23/3675; H01L 23/49827; H01L 24/97; H01L 25/0652; H01L 25/50; H01L 23/49838; H01L 2224/16145; H01L 2224/16225; H01L 2224/32225
See application file for complete search history.

(56) References Cited

U.S. PATENT DOCUMENTS

| | | |
|---|---|---|
| 6,008,536 A | 12/1999 | Mertol |
| 6,157,076 A | 12/2000 | Azotea et al. |
| 6,222,722 B1 | 4/2001 | Fukuzumi et al. |
| 6,251,796 B1 | 6/2001 | Abdul-Rid et al. |
| 6,322,903 B1 | 11/2001 | Siniaguine et al. |
| 6,384,473 B1 | 5/2002 | Peterson et al. |
| 6,403,444 B2 | 6/2002 | Fukuzumi et al. |
| 6,451,650 B1 | 9/2002 | Lou |
| 6,492,726 B1 | 12/2002 | Quek et al. |
| 6,613,672 B1 | 9/2003 | Wang et al. |
| 6,620,701 B2 | 9/2003 | Ninq |
| 6,624,505 B2 | 9/2003 | Badehl |
| 6,717,254 B2 | 4/2004 | Siniaguine |
| 6,746,876 B2 | 6/2004 | Itoh et al. |
| 6,787,916 B2 | 9/2004 | Halahan |
| 6,947,275 B1 | 9/2005 | Anderson et al. |
| 6,958,285 B2 | 10/2005 | Siniaguine |
| 7,011,988 B2 | 3/2006 | Forcier |
| 7,049,170 B2 | 5/2006 | Savastiouk et al. |
| 7,061,102 B2 | 6/2006 | Eghan et al. |
| 7,115,988 B1 | 10/2006 | Hool |
| 7,144,745 B2 | 12/2006 | Badehi |
| 7,183,643 B2 | 2/2007 | Gibson et al. |
| 7,186,586 B2 | 3/2007 | Savastiouk et al. |
| 7,400,036 B2 | 7/2008 | Tan |
| 7,670,921 B2 | 3/2010 | Chinthakindi et al. |
| 7,786,591 B2 | 8/2010 | Khan et al. |
| 7,863,096 B2 | 1/2011 | England |
| 7,906,803 B2 | 3/2011 | Shiova et al. |
| 7,928,548 B2 | 4/2011 | Bernstein et al. |
| 7,964,508 B2 | 6/2011 | Savastiouk et al. |
| 7,977,579 B2 | 7/2011 | Bathan et al. |
| 7,989,270 B2 | 8/2011 | Huang et al. |
| 8,018,068 B1 | 9/2011 | Scanlan et al. |
| 8,071,470 B2 | 12/2011 | Khor et al. |
| 8,072,082 B2 | 12/2011 | Yean et al. |
| 8,076,788 B2 | 12/2011 | Haba et al. |
| 8,102,039 B2 | 1/2012 | Noma et al. |
| 8,110,862 B2 | 2/2012 | Cheng et al. |
| 8,183,696 B2 | 5/2012 | Meyer et al. |
| 8,257,985 B2 | 9/2012 | Stevenson et al. |
| 8,377,829 B2 | 2/2013 | Yeh et al. |
| 8,378,480 B2 | 2/2013 | Cheng et al. |
| 8,397,013 B1 | 3/2013 | Rosenband et al. |
| 8,426,961 B2 | 4/2013 | Shih et al. |
| 8,470,668 B2 | 6/2013 | Cho et al. |
| 8,518,753 B2 | 8/2013 | Wu et al. |
| 8,519,537 B2 | 8/2013 | Jenq et al. |
| 8,525,318 B1 | 9/2013 | Kim et al. |
| 8,575,493 B1 | 11/2013 | Xu et al. |
| 8,598,695 B2 | 12/2013 | Oganesian et al. |
| 8,629,546 B1 | 1/2014 | Scanlan et al. |
| 8,674,423 B2 | 3/2014 | Collins et al. |
| 8,830,689 B2 | 9/2014 | Kim et al. |
| 9,165,793 B1 | 10/2015 | Wang et al. |
| 9,252,127 B1 | 2/2016 | Shen et al. |
| 2001/0050428 A1* | 12/2001 | Ando ............... H01L 21/563 257/700 |
| 2004/0134796 A1 | 7/2004 | Shelp et al. |
| 2004/0174682 A1 | 9/2004 | Lin et al. |
| 2004/0178495 A1 | 9/2004 | Yean |
| 2004/0183187 A1 | 9/2004 | Yamasaki et al. |
| 2004/0201111 A1 | 10/2004 | Thurgood |
| 2004/0238934 A1 | 12/2004 | Warner et al. |
| 2005/0046002 A1 | 3/2005 | Lee et al. |
| 2005/0047094 A1 | 3/2005 | Hsu |
| 2005/0068739 A1 | 3/2005 | Arvelo et al. |
| 2005/0196095 A1 | 9/2005 | Karashima et al. |
| 2005/0263869 A1 | 12/2005 | Tanaka et al. |
| 2005/0266701 A1 | 12/2005 | Aoyagi |
| 2007/0029654 A1 | 2/2007 | Sunohara et al. |
| 2007/0045798 A1 | 3/2007 | Horie |
| 2007/0197013 A1 | 8/2007 | Trezza |
| 2007/0221399 A1 | 9/2007 | Nishizawa et al. |
| 2007/0235850 A1 | 10/2007 | Gerber et al. |
| 2008/0128897 A1 | 6/2008 | Chao |
| 2008/0244902 A1 | 10/2008 | Blackwell |
| 2008/0280394 A1 | 11/2008 | Murtuza et al. |
| 2009/0008762 A1 | 1/2009 | Jung et al. |
| 2009/0057884 A1* | 3/2009 | Too ............... H01L 23/04 257/723 |
| 2009/0115047 A1 | 5/2009 | Haba et al. |
| 2009/0186446 A1* | 7/2009 | Kwon ............... H01L 23/055 438/107 |
| 2009/0212407 A1 | 8/2009 | Foster et al. |
| 2009/0267238 A1 | 10/2009 | Joseph et al. |
| 2010/0025081 A1 | 2/2010 | Arai et al. |
| 2010/0081236 A1 | 4/2010 | Yang et al. |
| 2010/0084761 A1 | 4/2010 | Masatoshi |
| 2010/0134991 A1 | 6/2010 | Kim et al. |
| 2010/0144101 A1 | 6/2010 | Chow et al. |
| 2010/0224980 A1 | 9/2010 | Chahal |
| 2010/0230797 A1 | 9/2010 | Honda |
| 2010/0230806 A1 | 9/2010 | Huang et al. |
| 2010/0276799 A1 | 11/2010 | Heng et al. |
| 2011/0027967 A1 | 2/2011 | Beyne et al. |

(56) References Cited

U.S. PATENT DOCUMENTS

| | | |
|---|---|---|
| 2011/0068444 A1 | 3/2011 | Chi et al. |
| 2011/0068468 A1 | 3/2011 | Lin et al. |
| 2011/0080713 A1 | 4/2011 | Sunohara |
| 2011/0095403 A1 | 4/2011 | Lee |
| 2011/0101349 A1 | 5/2011 | Oda |
| 2011/0221072 A1 | 9/2011 | Chin |
| 2011/0287606 A1 | 11/2011 | Brun et al. |
| 2011/0300668 A1 | 12/2011 | Parvarandeh |
| 2011/0304036 A1 | 12/2011 | Son |
| 2012/0001339 A1 | 1/2012 | Malatkar |
| 2012/0020026 A1 | 1/2012 | Oganesian |
| 2012/0049332 A1 | 3/2012 | Chen et al. |
| 2012/0061852 A1 | 3/2012 | Su et al. |
| 2012/0086135 A1 | 4/2012 | Thompson et al. |
| 2012/0091583 A1 | 4/2012 | Kawashita et al. |
| 2012/0101540 A1 | 4/2012 | O'Brien et al. |
| 2012/0106228 A1 | 5/2012 | Lee |
| 2012/0228778 A1 | 9/2012 | Kosenko et al. |
| 2012/0276733 A1 | 11/2012 | Saeki et al. |
| 2012/0295415 A1 | 11/2012 | Ono |
| 2012/0319300 A1 | 12/2012 | Kim |
| 2013/0010441 A1 | 1/2013 | Oganesian et al. |
| 2013/0014978 A1 | 1/2013 | Uzoh et al. |
| 2013/0032390 A1 | 2/2013 | Hu et al. |
| 2013/0069239 A1 | 3/2013 | Kim et al. |
| 2013/0082383 A1 | 4/2013 | Aoya |
| 2013/0082399 A1 | 4/2013 | Kim et al. |
| 2013/0087917 A1 | 4/2013 | Jee et al. |
| 2013/0093075 A1 | 4/2013 | Liu et al. |
| 2013/0099368 A1 | 4/2013 | Han |
| 2013/0119527 A1 | 5/2013 | Luo et al. |
| 2013/0119528 A1 | 5/2013 | Groothuis et al. |
| 2013/0146991 A1 | 6/2013 | Otremba et al. |
| 2013/0181354 A1 | 7/2013 | Khan et al. |
| 2013/0187292 A1 | 7/2013 | Semmelmeyer et al. |
| 2013/0228898 A1 | 9/2013 | Ide |
| 2013/0241026 A1 | 9/2013 | Or-Bach et al. |
| 2013/0267046 A1 | 10/2013 | Or-Bach et al. |
| 2013/0270660 A1 | 10/2013 | Bryzek et al. |
| 2013/0292840 A1 | 11/2013 | Shoemaker et al. |
| 2013/0313680 A1 | 11/2013 | Oqanesian et al. |
| 2014/0036454 A1 | 2/2014 | Caskey et al. |
| 2014/0070380 A1 | 3/2014 | Chiu et al. |
| 2014/0091461 A1 | 4/2014 | Shen |
| 2014/0134796 A1 | 5/2014 | Kelly et al. |
| 2014/0134803 A1 | 5/2014 | Kelly et al. |
| 2014/0134804 A1 | 5/2014 | Kelly |
| 2014/0225244 A1 | 8/2014 | Smith et al. |
| 2014/0246227 A1 | 9/2014 | Lin et al. |
| 2014/0252655 A1 | 9/2014 | Tran et al. |
| 2014/0264811 A1 | 9/2014 | Wu |
| 2014/0319683 A1 | 10/2014 | Lin et al. |
| 2014/0328023 A1* | 11/2014 | Choi ............ H01L 23/552 361/715 |
| 2014/0361410 A1 | 12/2014 | Yamamichi et al. |
| 2015/0001731 A1 | 1/2015 | Shuto |
| 2015/0021755 A1 | 1/2015 | Hsiao et al. |
| 2015/0262902 A1 | 9/2015 | Shen et al. |
| 2015/0262928 A1 | 9/2015 | Shen et al. |
| 2015/0262972 A1 | 9/2015 | Katkar |
| 2015/0333049 A1 | 11/2015 | Woychik |
| 2016/0079214 A1 | 3/2016 | Caskey |

FOREIGN PATENT DOCUMENTS

| | | |
|---|---|---|
| EP | 1688994 B1 | 8/2008 |
| EP | 2546876 A1 | 1/2013 |
| EP | 2555239 A2 | 2/2013 |
| WO | WO 2005/022630 A1 | 3/2005 |
| WO | WO 2006/124597 A2 | 11/2006 |
| WO | WO 2007/142721 A1 | 12/2007 |
| WO | WO 2009/070348 A1 | 6/2009 |
| WO | WO 2012/169162 A1 | 12/2012 |
| WO | WO 2013/062533 A1 | 5/2013 |

OTHER PUBLICATIONS

Chipscale Review, "The Impact of CSPs on Encapsulation Materials," ChipScale Review publication issue Mar. 1998, retrieved Feb. 21, 2014, 6 pages.

Dr. Paul A. Magill, "A New Thermal-Management Paradigm for Power Devices," Power Electronics Technology, Nov. 2008, pp. 26-30.

Herming Chiueh et al., "A Dynamic Thermal Management Circuit for System-On-Chip Designs," Analog Integrated Circuits and Signal Processing, 36, pp. 175-181, Jan. 25, 2003.

Hybrid Memory Cube Consortium, "Hybrid Memory Cube Specification 1.0," Last Revision Jan. 2013, 122 pages, Retrieved from: http://hybridmemorycube.org/specificationdownload/.

K. Zoschke et al., "Hermetic Wafer Level Packaging of MEMS Components Using Through Silicon Via and Wafer to Wafer Bonding Technologies" (2013 Electronic Components & Technology Conference, IEEE, pp. 1500-1507).

Lau et al., "Thin-Wafer Handling with a Heat-Spreader Wafer for 2.5D/3D IC Integration," 46th International Symposium on Microelectronics (IMAPS 2013) Sep. 30-Oct. 3, 2013, Orlando, FL USA, pp. 1-8 [389-396].

Li Shang et al., "Thermal Crisis: Challenges and Potential Solutions," Potentials, vol. 25, Issue 5, Sep./Oct. 2006, pp. 31-35.

Nakamura et al., "Technology Trends and Future History of Semiconductor Packaging Substrate Material," Hitachi Chemical Review Technical Report No. 55, May 2013, pp. 24-29.

Pulliam, Wayne, "Designing with BGAs," AMO presentation, 2008, 62 pages.

San Hwui Lee et al., "Wafer-to-Wafer Alignment for Three Dimensional Integration: A Review," Journal of Microelectromechanical Systems, vol. 20, Issue 4, Aug. 2011, pp. 885-898.

U.S. Appl. No. 14/201,585, filed Mar. 7, 2014.

U.S. Appl. No. 14/214,365 titled, "Integrated Circuits Protected by Substrates with Cavities, and Methods of Manufacture," filed Mar. 14, 2014, 40 pages.

Dreiza; Moody et al., "Joint Project for Mechanical Qualification of Next Generation High Density Package-on-Package (PoP) with Through Mold Via Technology," Amkor Technology, EMPC2009—17th European Microelectronics & Packaging Conference, Jun. 16th, Rimini, Italy, 8 pages.

Zwenger; Curtis et al., "Next Generation Package-on_Package (PoP) Platform with Through Mold Via (TMV™) Interconnection Technology," Amkor Technology, Originally published in the proceedings of the IMPAS Device Packaging Conference, Scottsdale, AZ, Mar. 10-12, 2009, 8 pages.

Kim; Jinseong et al., "Application of Through Mold Via (TMV) as PoP base package," Amkor Technology, 2008 IEEE Reprinted from ECTC2008 Proceedings, 6 pages.

U.S. Appl. No. 14/250,317 titled "Die Stacks With One or More Bond Via Arrays," filed Apr. 10, 2014, 58 pages.

Das; Rabindra N. et al., "Package-Interpose-Package (PIP) Technology for High End Electronics," Endicott Interconnect Technologies, Inc., retrieved Jul. 31, 2014, 4 pages.

McCormick; Heather et al., "ASS Embly and Reliability Assessment of Fine Pitch TMV Package on Package (PoP) Components," Amkor Technology Inc., Originally published in the Proceedings of the SMTA International Conference, San Diego, CA, Oct. 4-8, 2009, 8 pages.

U.S. Appl. No. 14/288,064 titled, "Integrated Circuit Assemblies With Reinforcement Frames, and Methods of Manufacture," filed May 27, 2014.

U.S. Appl. No. 14/328,380 titled, "Microelectronic Assemblies With Integrated Circuits and Interposers With Cavities, and Methods of Manufacture," filed Jul. 10, 2014.

International Search Report and Written Opinion, dated May 12, 2015, 11 pages, PCT Patent Application No. PCT/US2015/019609.

International Search Report and Written Opinion, dated Aug. 6, 2015, 1 O pages, PCT Patent Application No. PCT/US2015/028172.

Turner et al., "Mechanics of direct wafer bonding", 2006, pp. 171-188, vol. 462, doi: 10.1098/rspa.2005.1571, Proceedings of the Royal Society A, London, United Kingdom.

(56) References Cited

OTHER PUBLICATIONS

United States Patent and Trademark Office, First Action Interview Pilot Program Pre-Interview Communication, dated Oct. 22, 2014, for U.S. Appl. No. 14/214,365, filed Mar. 14, 2014.
Strandjord et al., "Bumping for WLCSP using Solder Ball Attach on electrolessss NiAu UBM", 2008, 29 pages, Pac Tech USA-Packaging Technologies, Inc., Santa Clara, California.
Boyle et al., "Epoxy Resins", 2001, pp. 78-89, vol. 21, ASM Handbook, Composites (ASM International).
U.S. Patent Application, "Interposers With Circuit Modules Encapsulated by Moldable Material in a Cavity, and Methods of Fabrication", filed Dec. 2, 2014, U.S. Appl. No. 14/558,462, 19 pages.
Pre-Interview First Office Action dated Oct. 22, 2014 of U.S. Appl. No. 14/214,365.
Final Office Action dated Mar. 2, 2015 of U.S. Appl. No. 14/214,365.
Notice of Allowance dated Apr. 16, 2015 of U.S. Appl. No. 14/268,899.
U.S. Appl. No. 14/268,899 titled, "Making Electrical Components in Handle Wafers of Integrated Circuit Packages," filed May 2, 2014.
U.S. Appl. No. 14/558,462 titled, "Interpose RS With Circuit Modules Encapsulated by Moldable Material in a Cavity, and Methods of Fabrication," filed Dec. 2, 2014.
Office Action dated Jul. 9, 2015 for U.S. Appl. No. 14/558,462, 11 pages.
International Search Report and Written Opinion for PCT/US2015/032572 dated Nov. 23, 2015.
International Search Report dated Sep. 21, 2015 for International Application No. PCT/US2015/033786, International Filing Date Feb. 6, 2015.
U.S. Appl. No. 14/745,237 titled, "Microelectronic Assemblies With Cavities, and Methods of Fabrication," filed May 19, 2015.
International preliminary report on patentability in PCT Patent Application No. PCT/US2015/019609, dated Sep. 13, 2016 (7 pages).

* cited by examiner

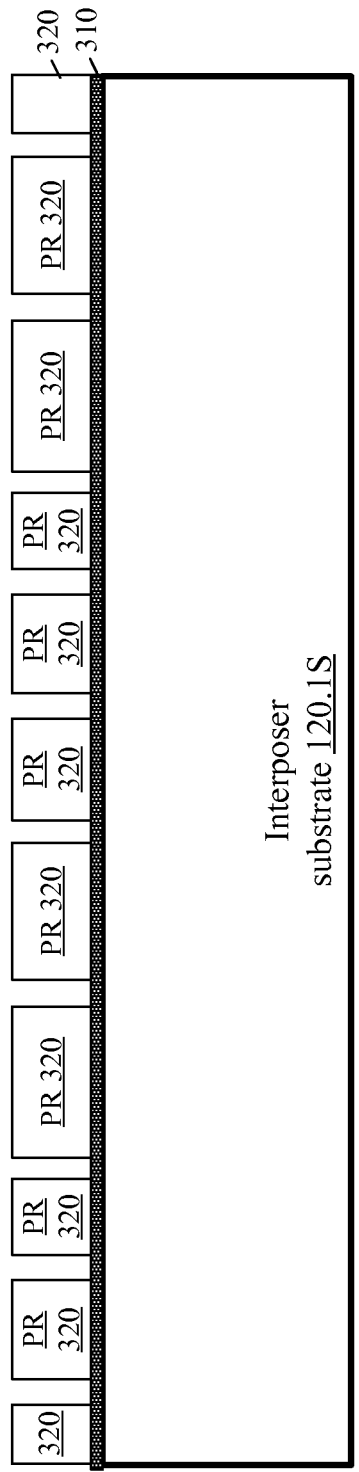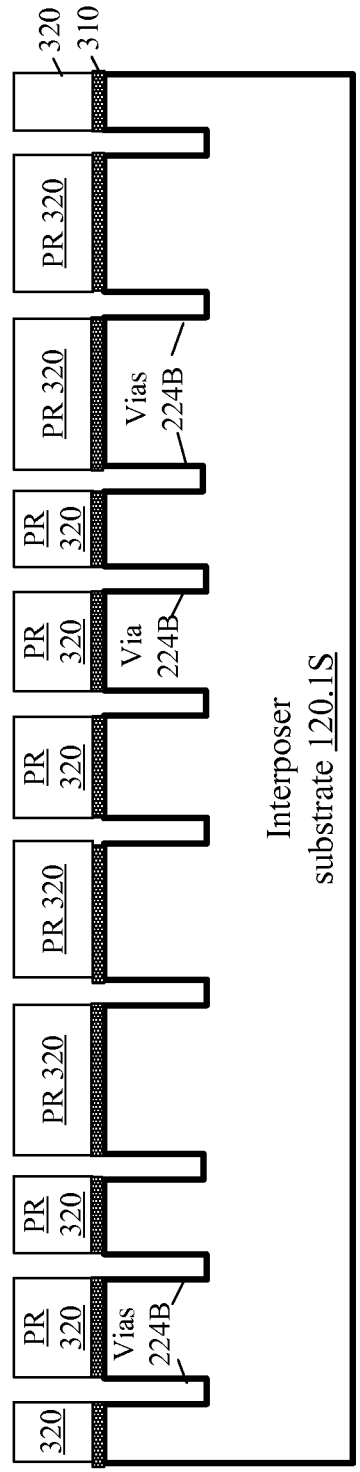

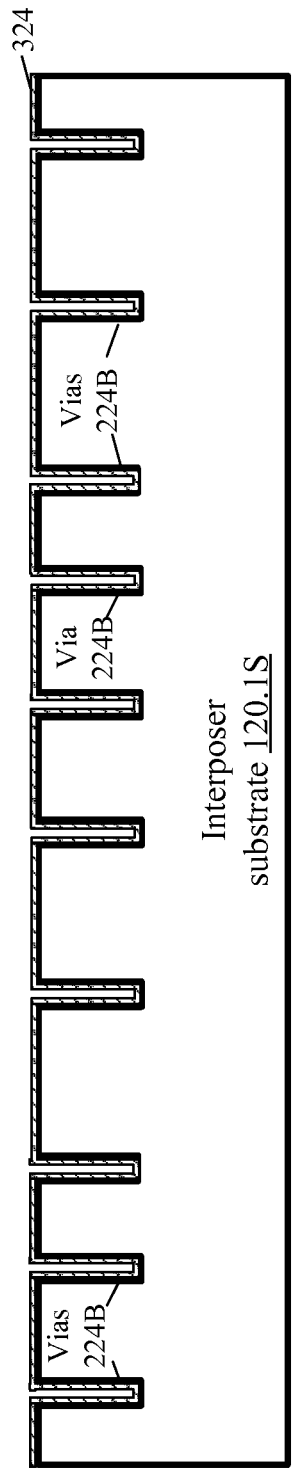
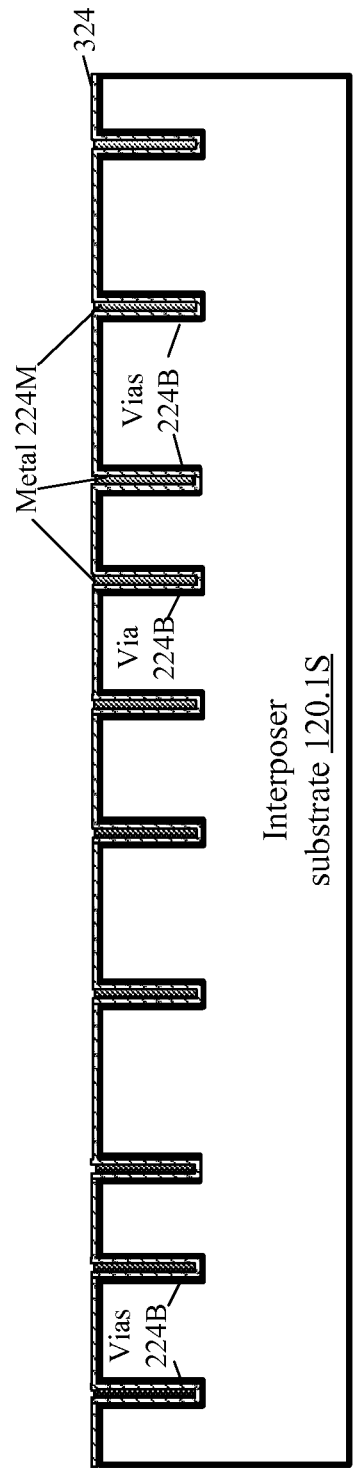

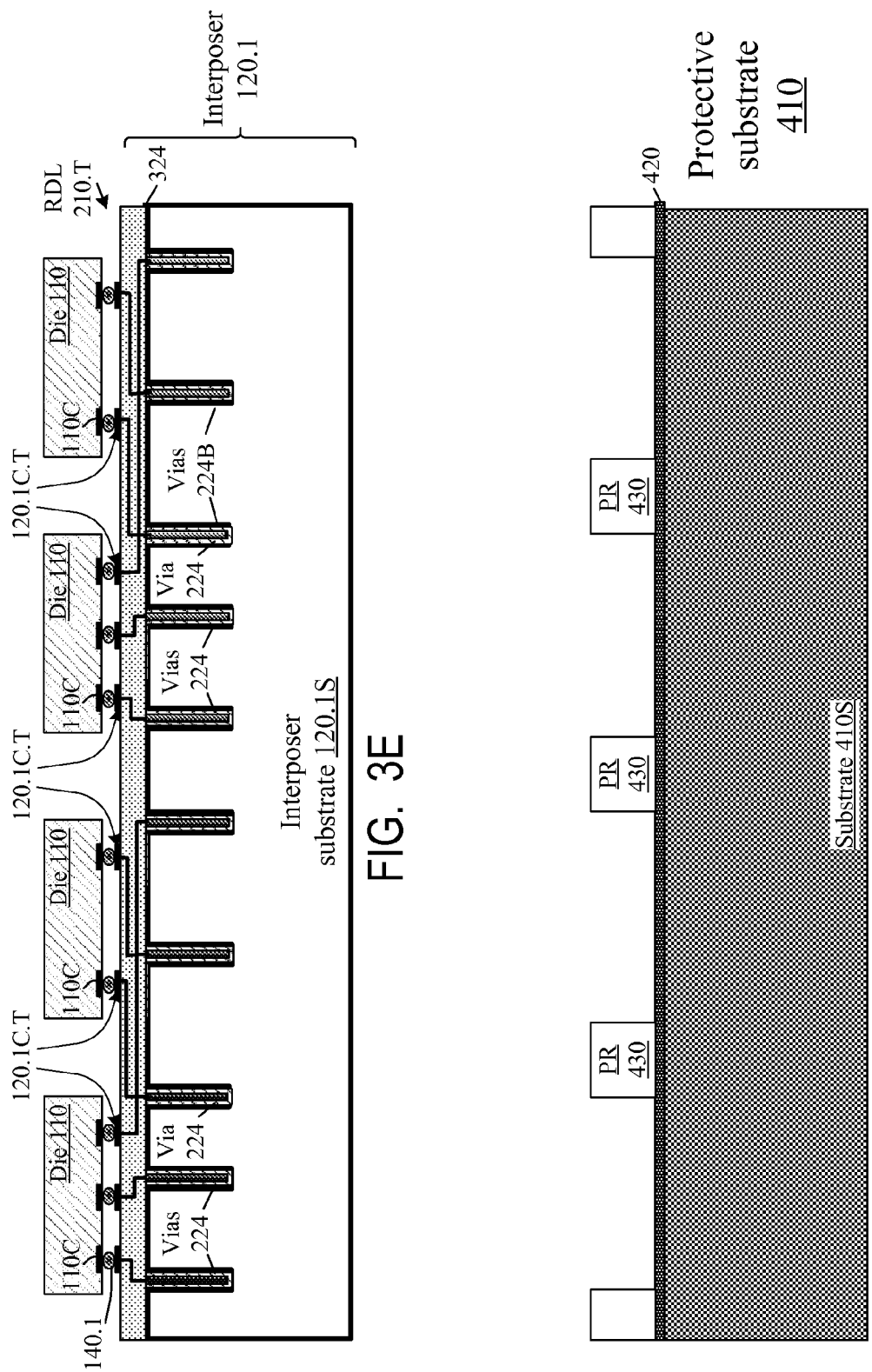

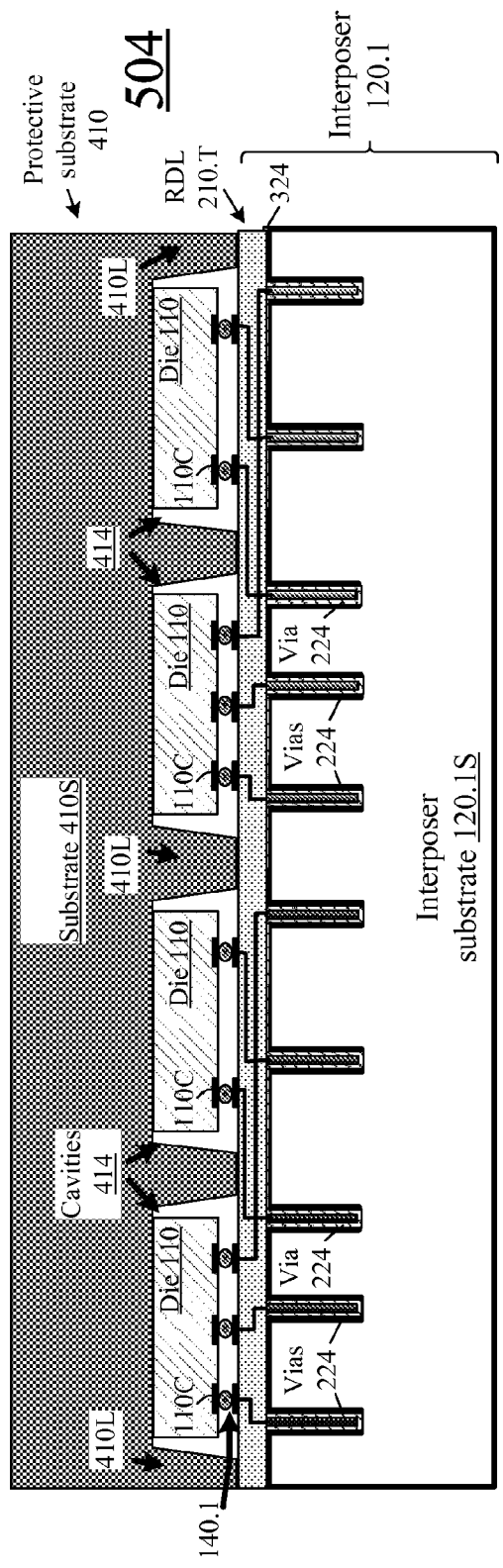
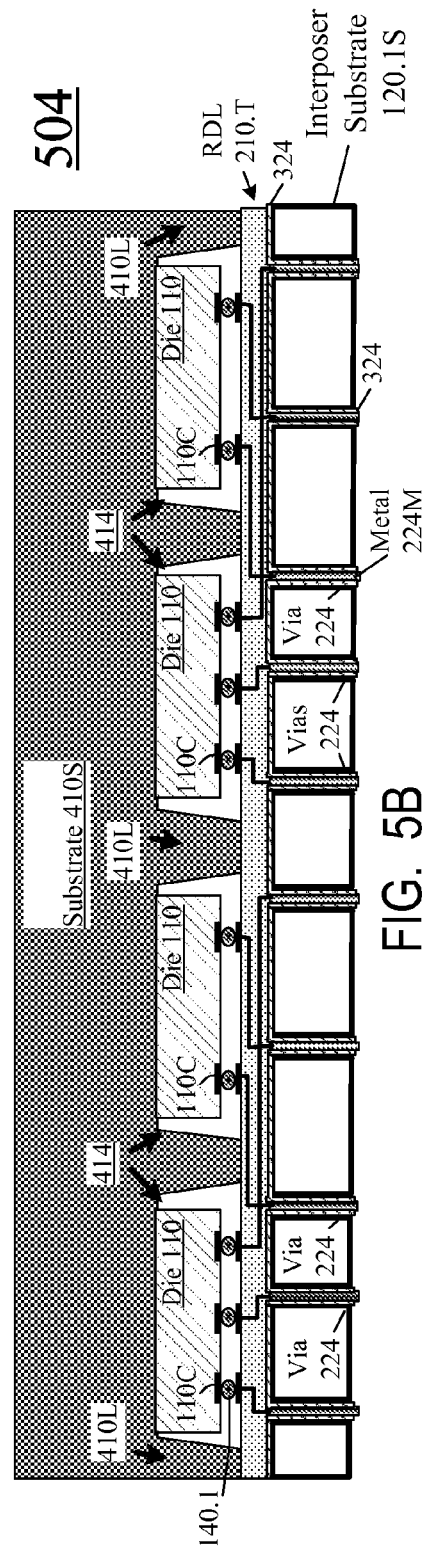
FIG. 5A
FIG. 5B

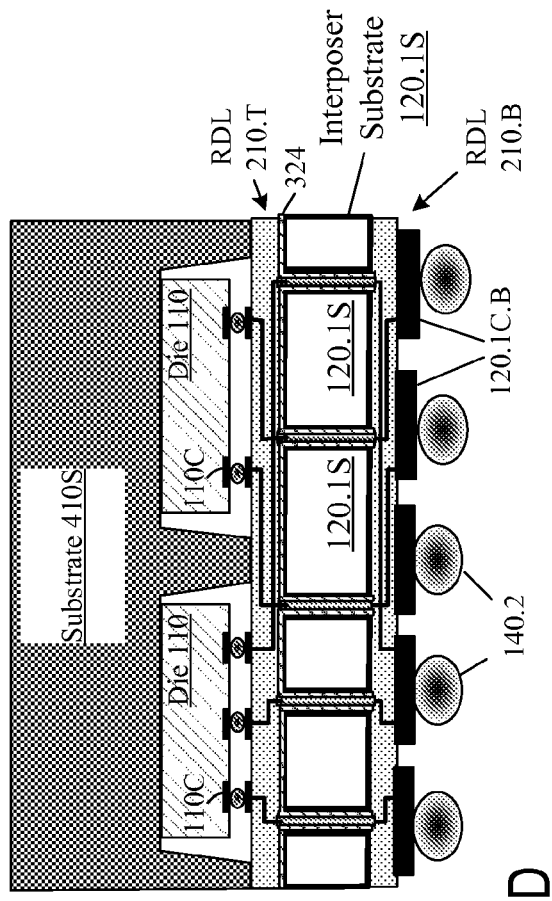
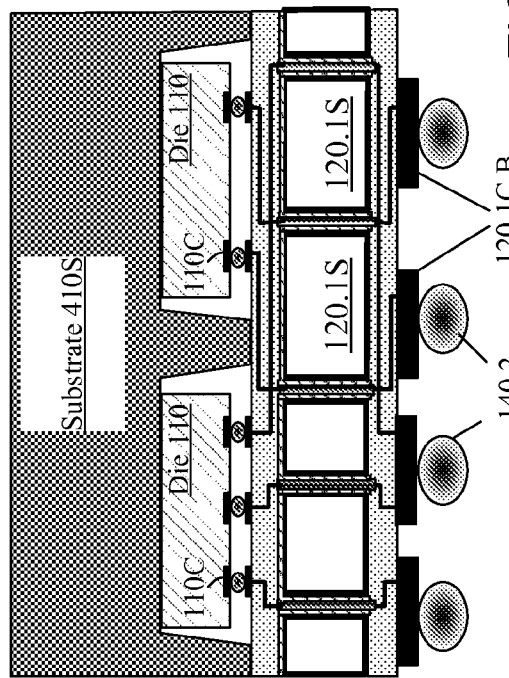
FIG. 5D

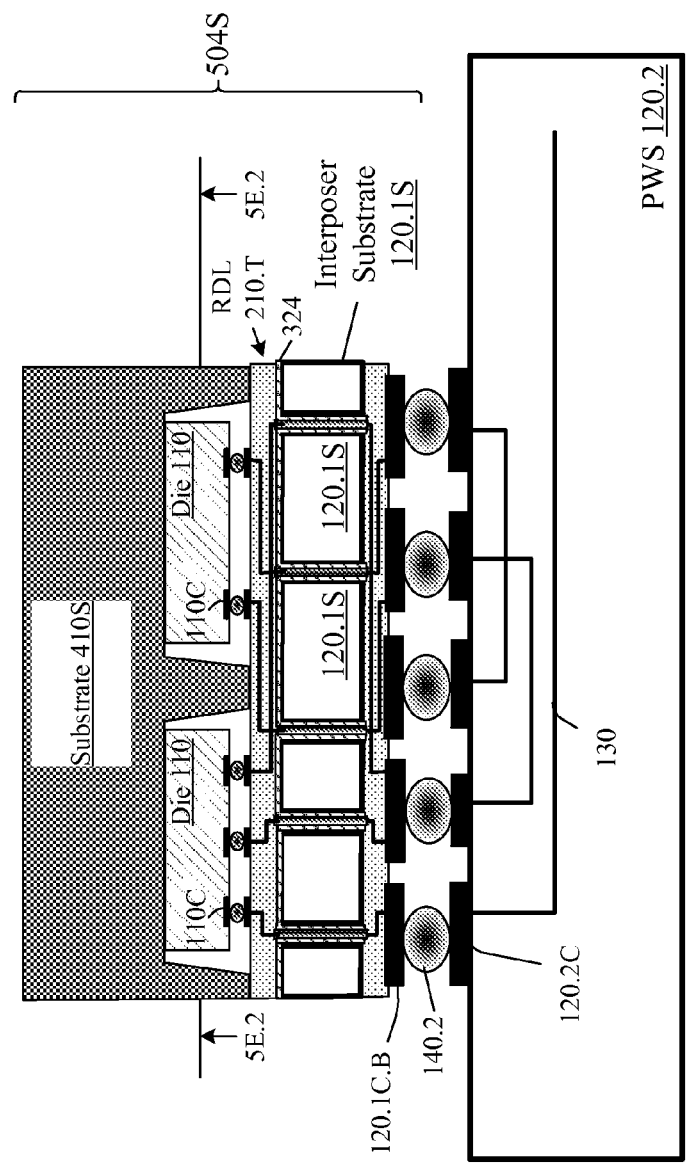
FIG. 5E.1
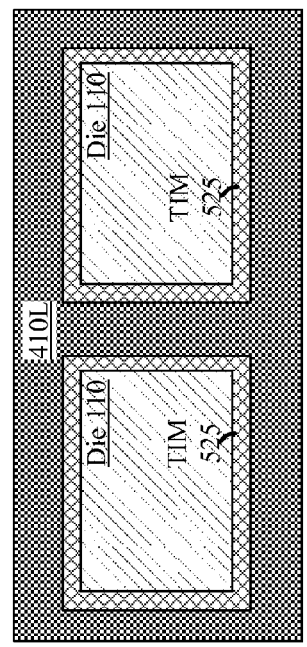
FIG. 5E.2

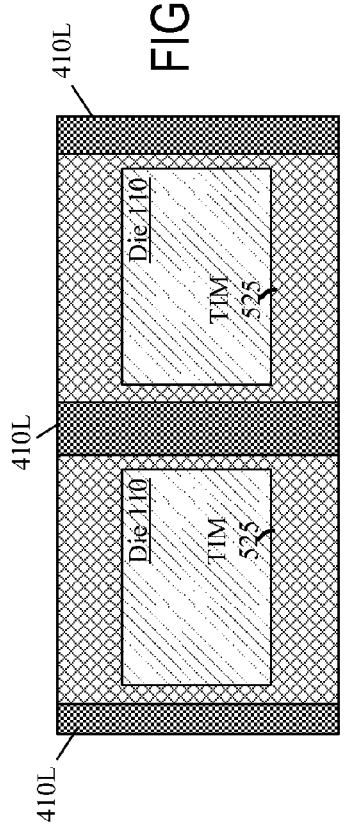
FIG. 5E.3
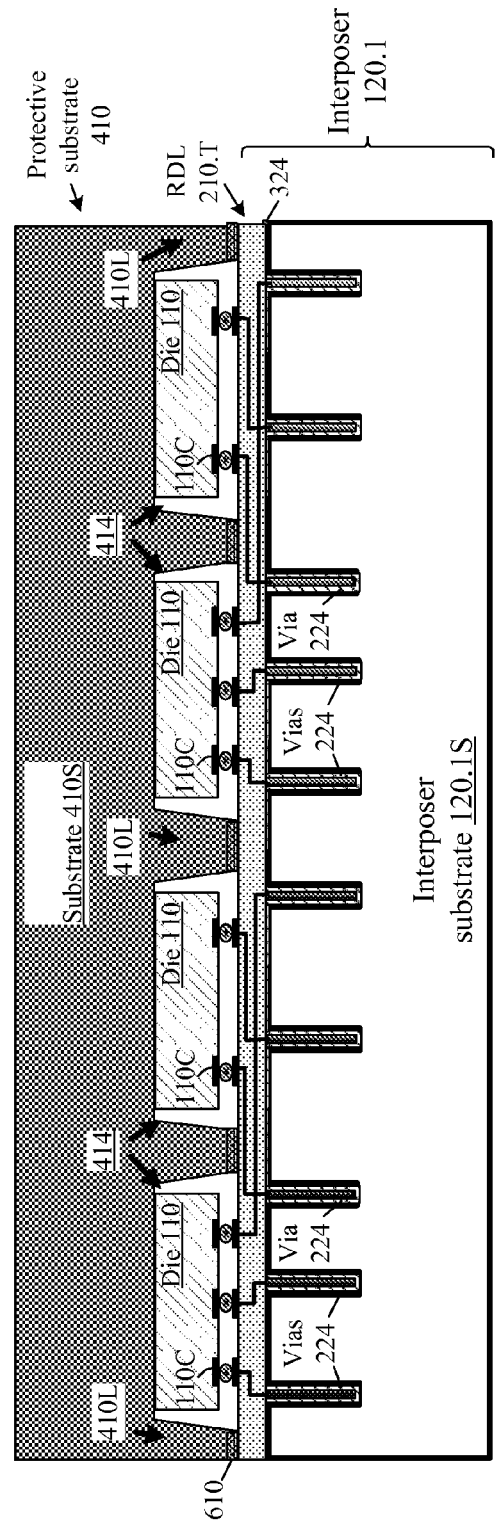
FIG. 6

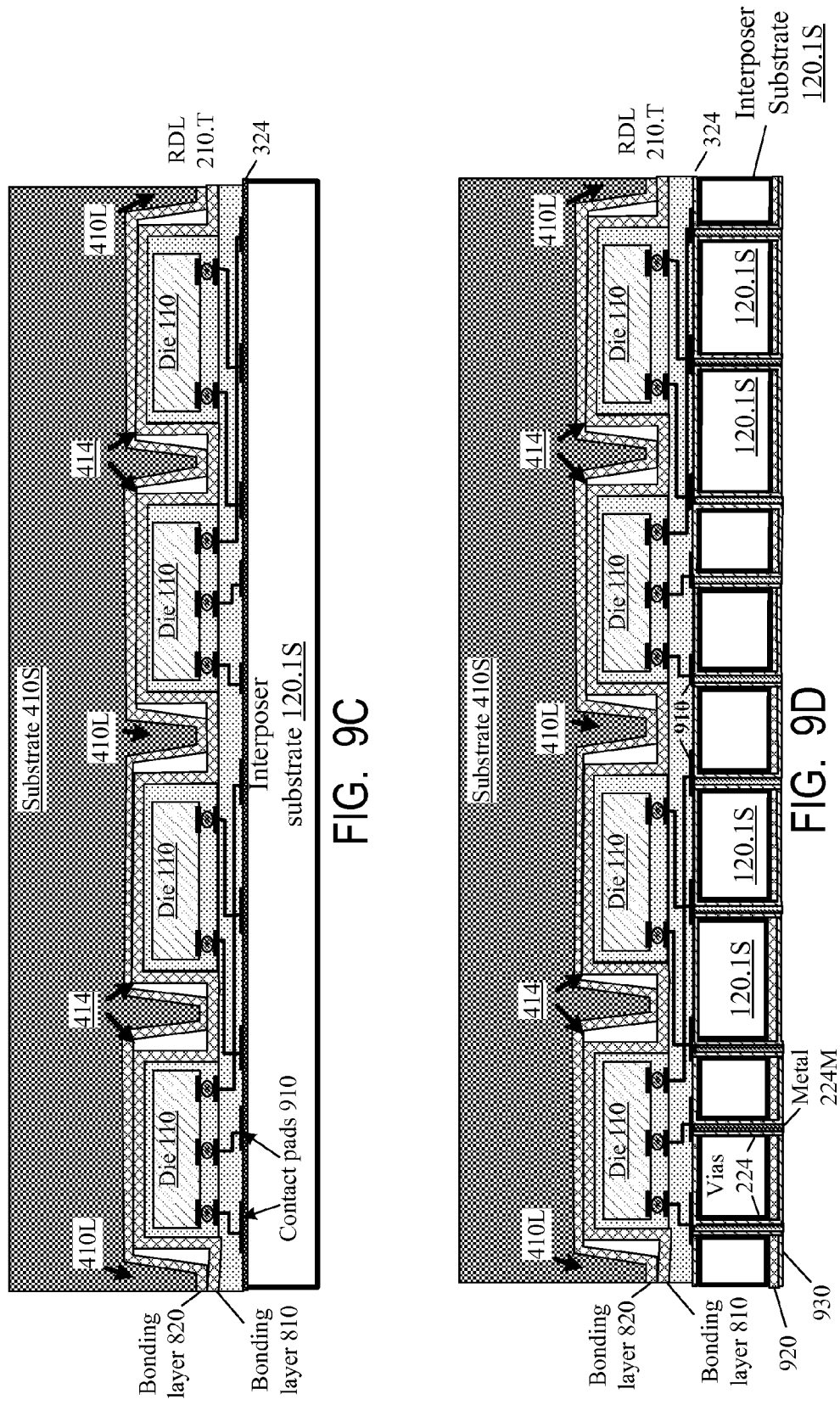

INTEGRATED CIRCUITS PROTECTED BY SUBSTRATES WITH CAVITIES, AND METHODS OF MANUFACTURE

CROSS-REFERENCE TO RELATED APPLICATIONS

The present application is a continuation of U.S. patent application Ser. No. 14/214,365, filed Mar. 14, 2014, incorporated herein by reference, which claims priority of U.S. provisional application No. 61/952,066 filed on Mar. 12, 2014, titled "INTEGRATED CIRCUITS PROTECTED BY SUBSTRATES WITH CAVITIES, AND METHODS OF MANUFACTURE", incorporated herein by reference.

BACKGROUND OF THE INVENTION

This document relates to integrated circuits, and more particularly to assemblies having dies that include semiconductor integrated circuits.

In fabrication of integrated circuits, one or more circuits are manufactured in a semiconductor wafer and are then separated into "dies" (also called "chips") in a process called "singulation" or "dicing". The dies, such as shown at 110 in FIG. 1, are attached to a wiring substrate ("WS", e.g. printed wiring board) 120 which has conductive lines 130 connecting the dies to each other and to other elements of the system. More particularly, the dies have contact pads 110C connected to the dies' circuits (not shown), and these contact pads are attached to contact pads 120C of WS 120. Pads 120C are interconnected by conductive lines 130. The attachment of pads 110C to pads 120C is performed by connections 140 which may include solder, conductive epoxy, or other types.

Encapsulant 150 (e.g. epoxy with silica or other particles) protects the dies 110 and the connections 140 from moisture and other contaminants, ultraviolet light, alpha particles, and possibly other harmful elements. The encapsulant also strengthens the die-to-WS attachment against mechanical stresses, and helps conduct heat away from the dies (to an optional heat sink 160 or directly to the ambient (e.g. air)).

It is desirable to provide improved protection of dies from mechanical stresses, heat, and harmful elements.

SUMMARY

This section summarizes some of the exemplary implementations of the invention.

In some embodiments, the dies are protected by an additional, protective substrate attached to a wiring substrate. The dies are located in cavities in the protective substrate (the dies may protrude out of the cavities). The protective substrate may be similar to cap wafers used to protect MEMS components (Micro-Electro-Mechanical Structures); see K. Zoschke et al., "Hermetic Wafer Level Packaging of MEMS Components Using Through Silicon Via and Wafer to Wafer Bonding Technologies" (2013 Electronic Components & Technology Conference, IEEE, pages 1500-1507); see also U.S. Pat. No. 6,958,285 issued Oct. 25, 2005 to Siniaguine. However, in some embodiments, the protective substrate puts pressure on the die (e.g. each die may physically contact the cavity surface) to strengthen the die-to-WS 120 mechanical attachment, to provide good thermal conductivity between the die and the protective substrate, to help flatten the die if it is warped, and to reduce the vertical dimension. The protective substrate may or may not have its own circuitry connected to the dies or to the wiring substrate.

In some embodiments, the die does not contact the cavity surface, but the die is separated from the cavity surface by solid material (e.g. a bonding layer) which physically contacts the die and the cavity surface. In some embodiments, the die or the solid material physically contacts the cavity surface at some but not all operating temperatures (e.g. the physical contact may exist only at higher temperatures at which the die expands). An operating temperature is a temperature at which electrical functionality can be obtained.

In some embodiments, the cavity contains a stack of dies, and the top die in a stack contacts the cavity surface (or a solid material overlying the top die physically contacts the cavity surface). In some embodiments, the entire top surface of each die, or the top die in the stack if there is a stack, physically contacts the cavity surface. In some embodiments, the protective substrate puts downward pressure on the dies in each cavity to strengthen the dies' attachment to the wiring substrate and to counteract the die warpage.

In some embodiments, the wiring substrate is an interposer. Interposers are commonly used as intermediate substrates to accommodate a mismatch between die fabrication technology and printed wiring substrates (PWSs). More particularly, the die's contact pads 110C can be placed much closer to each other (at a smaller pitch) than PWS pads 120C. Therefore (FIG. 2), an intermediate substrate 120.1 can be used between the dies 120 and the PWS (shown at 120.2). Interposer 120.1 includes a substrate 120.1S (e.g. semiconductor or other material), a redistribution layer (RDL) 210.T on top of substrate 120.1S, and another redistribution layer 210.B on the bottom of substrate 120.1S. Each RDL 210.T, 210.B includes interconnect lines 216 insulated from each other and from substrate 120.1S by the RDL's dielectric 220. Lines 216 are connected to contact pads 120.1C.T on top of the interposer and contact pads 120.1C.B on the bottom. Lines 216 of RDL 210.T are connected to lines 216 of RDL 210.B by conductive (e.g. metallized) through-vias 224. Pads 120.1C.T are attached to the dies' pads 110C by connections 140.1 as in FIG. 1. Pads 120.1C.B are attached to pads 120.2C of PWS 120.2 with connections 140.2. Pads 120.1C.B are at a larger pitch than pads 120.1C.T, to accommodate the pitch of the PWS contacts 120.2C.

The interposer substrate 120.1S should be as thin as possible to shorten the signal paths between dies 110 and PWS 120.2 and thus make the system faster and less power hungry. Also, if the interposer is thin, fabrication of metallized vias 224 is facilitated. However, thin interposers are hard to handle: they are brittle, easily warped, and do not absorb or dissipate heat during fabrication. Therefore, a typical fabrication process (such as described in Zoschke et al. cited above) attaches the interposer to a temporary substrate ("support wafer") during fabrication. The support wafer is later removed. Attaching and detaching temporary support wafers is burdensome. The process of the aforementioned U.S. Pat. No. 6,958,285 does not use the support wafer. Neither do some of the novel processes described below.

The invention is not limited to the features and advantages described above, and includes other features described below.

BRIEF DESCRIPTION OF THE DRAWINGS

FIGS. 3A, 3B, 3C, 3D, 3E, 4A, 4B, 4C, 5A, 5B, 5C, 5D, 5E.1, 6, 7, 8A, 8B, 8C, 9A, 9B, 9C, 9D, 10 illustrate vertical cross-sections of structures according to some embodiments as set forth in detail below.

FIGS. 5E.2 and 5E.3 are bottom views of horizontal cross sections according to some embodiments as set forth in detail below.

FIGS. 6, 7, 8A, 8B, 8C, 9A, 9B, 9C, 9D, 10, 11, 12 illustrate vertical cross-sections of structures according to some embodiments as set forth in detail below.

DESCRIPTION OF SOME EMBODIMENTS

Figure 1:
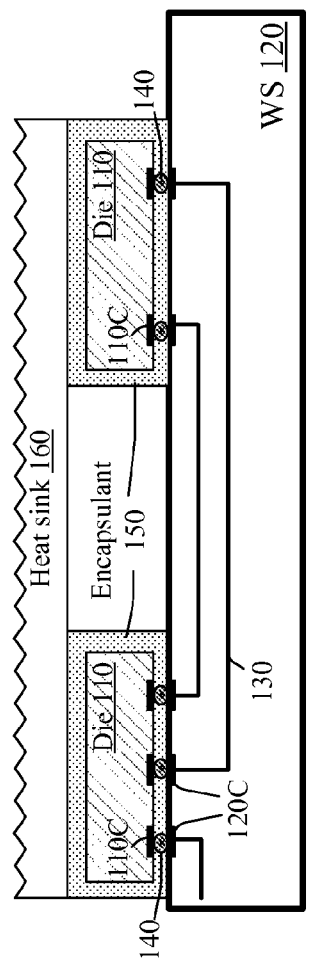
FIGS. 1 and 2 illustrate vertical cross-sections of assemblies including integrated circuits and constructed according to prior art.

The embodiments described in this section illustrate but do not limit the invention. In particular, the invention is not limited to particular materials, processes, dimensions, or other particulars except as defined by the appended claims.

FIG. 3A shows the beginning stages of fabrication of an interposer 120.1 according to some embodiments of the present invention. The interposer substrate 120.1S is initially chosen to be sufficiently thick to provide easy handling and adequate heat dissipation in fabrication. In some embodiments, substrate 120.1S is a monocrystalline silicon wafer of a 200 mm or 300 mm diameter and a thickness of 650 micron or more. These materials and dimensions are exemplary and do not limit the invention. For example, substrate 120.1S can be made of other semiconductor materials (e.g. gallium arsenide), or glass, or sapphire, or metal, or possibly other materials. The substrate will later be thinned; for example, in case of silicon, the final thickness could be 5 to 50 microns. Again, these dimensions are not limiting.

Substrate 120.1S is patterned to form blind vias 224B (FIG. 3B). "Blind" means that the vias do not go through substrate 120.1S. This can be done, for example, as follows for silicon substrates. First, optional layer 310 (FIG. 3A) is formed on substrate 120.1S to protect the substrate and/or improve the adhesion of subsequently formed photoresist 320. For example, layer 310 can be silicon dioxide formed by thermal oxidation, chemical vapor deposition (CVD), or sputtering. Then photoresist 320 is deposited and photolithographically patterned to define the vias. Layer 310 and substrate 120.1S are etched in areas exposed by resist 320 to form the blind vias. The via depth is equal or slightly greater than the final depth of substrate 120.1S, e.g. 5 to 51 microns for some silicon-substrate embodiments. The vias can be formed by a dry etch, e.g. dry reactive ion etching (DRIE). An exemplary diameter of each via can be 60 microns or less, but other dimensions are possible. The vias can be vertical (as shown) or may have sloped sidewalls. As noted above, the particular dimensions, processes and other features are illustrative and not limiting.

The vias are then metallized. If substrate 120.1S is silicon, this can be done as follows. Photoresist 320 and protective layer 310 are removed, and a dielectric layer 324 (FIG. 3C) is formed on the entire top surface of substrate 120.1S. Dielectric 324 lines the via surfaces. In some embodiments, dielectric 324 is formed by thermal oxidation of the silicon substrate or by CVD or physical vapor deposition (PVD). Dielectric 324 will electrically insulate the substrate from subsequently formed metal in vias 224B. The dielectric thickness depends on the desired process parameters, and is 1 micron in an exemplary thermal-oxide embodiment (a thermal oxide is silicon dioxide formed by thermal oxidation). Other dimensions and materials can be used instead. Dielectric 324 can be omitted if substrate 120.1S is itself dielectric.

Then metal 224M (FIG. 3D) is formed in vias 224B over the dielectric 324. In the embodiment shown, metal 224M fills up the vias, but in other embodiments the metal is a liner on the via surfaces. In an exemplary embodiment, metal 224M is electroplated copper. For example, a barrier layer (metal or dielectric, not shown separately) is formed first on dielectric 324 to aid in copper adhesion and prevent copper diffusion into the dielectric 324 or substrate 120.1S. Suitable barrier layers may include a layer of titanium-tungsten (see Kosenko et al., US pre-grant patent publication 2012/0228778 published Sep. 13, 2012, incorporated herein by reference), and/or nickel containing layers (Uzoh et al., US 2013/0014978 published Jan. 17, 2013, incorporated herein by reference). Then a seed layer, e.g. copper, is formed on the barrier layer by physical vapor deposition (e.g. PVD, possibly sputtering). Then copper is electroplated on the seed layer to fill the vias 224B and cover the whole substrate 120.1S. The copper is then removed from the areas between the vias by chemical mechanical polishing (CMP). Optionally, the CMP may also remove the barrier layer (if present) from these areas, and may stop on dielectric 324. As a result, the copper and the barrier layer remain only in and over the vias 224B.

For ease of description, we will refer to vias 224 as "metallized", but non-metal conductive materials can also be used (e.g. doped polysilicon).

If layer 224M does not fill the vias but only lines the via surfaces, some other material (not shown) can be formed on layer 224M as a filler to fill the vias and provide a planar top surface for the wafer. This filler material can be polyimide deposited by spin coating for example.

Figure 2:
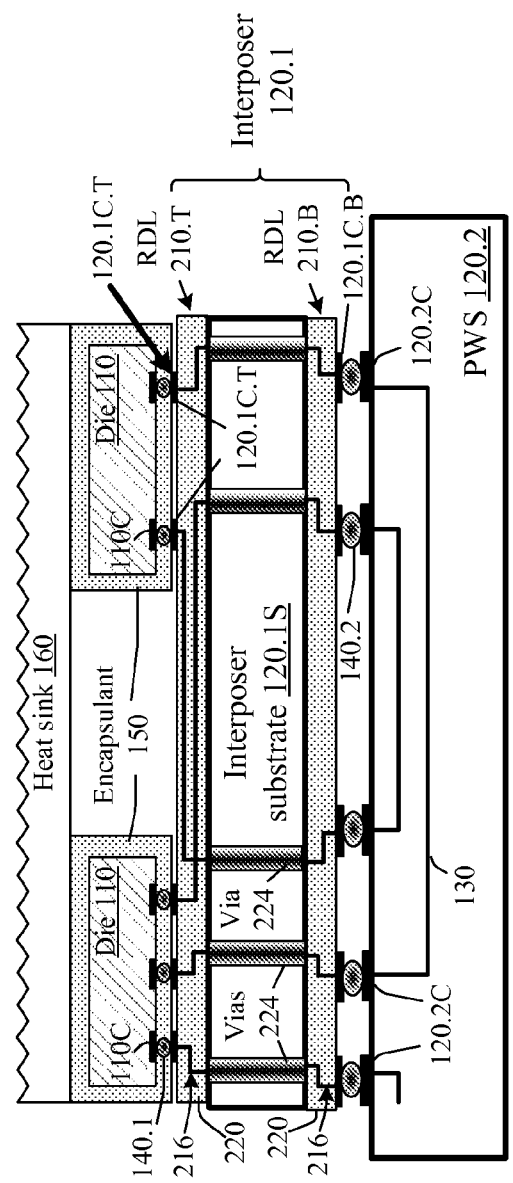

Optionally, RDL 210.T (FIG. 3E) is formed on top of substrate 120.1S to provide contact pads 120.1C.T at desired locations. RDL 210.T can be formed by prior art techniques described above in connection with FIGS. 1 and 2 for example. RDL 210.T is omitted if the contact pads 120.1C.T are provided by the top areas of metal 224M. In such a case, if substrate 120.1S is not dielectric, then a dielectric layer can be formed on the substrate and photolithographically patterned to expose the contact pads 120.1C.T.

Interposer 120.1 may include transistors, resistors, capacitors, and other devices (not shown) in substrate 120.1S and redistribution layer 210.T. These devices can be formed before, during and/or after the fabrication of vias 224 and RDL 210.T using the process steps described above and/or additional process steps. Such fabrication techniques are well known. See e.g. the aforementioned U.S. Pat. No. 6,958,285 and pre-grant patent publication 2012/0228778.

Dies 110 are attached to contact pads 120.1C.T with connections 140.1, using possibly prior art methods described above in connection with FIGS. 1 and 2 or other methods (e.g. diffusion bonding; in this case the connections 140.1 are not additional elements but are part of contact pads 110C and/or 120.1C.T).

Optionally, an encapsulant (not shown) can be formed around the dies and/or under the dies using the same techniques as described above in connection with FIG. 1 (e.g. by molding and/or underfilling). The encapsulant can be any suitable material (e.g. epoxy with silica or other particles). No encapsulant is used in some embodiments. Other embodiments use an encapsulant, but the requirements for the encapsulant are relaxed because the dies will be protected by an additional, protective substrate 410 (FIG. 5A) as described below. In some embodiments, the encapsulant is provided only underneath the dies (as underfill), i.e. only between the dies and substrate 120.1S (around the connections 140.1).

Figure 4B:
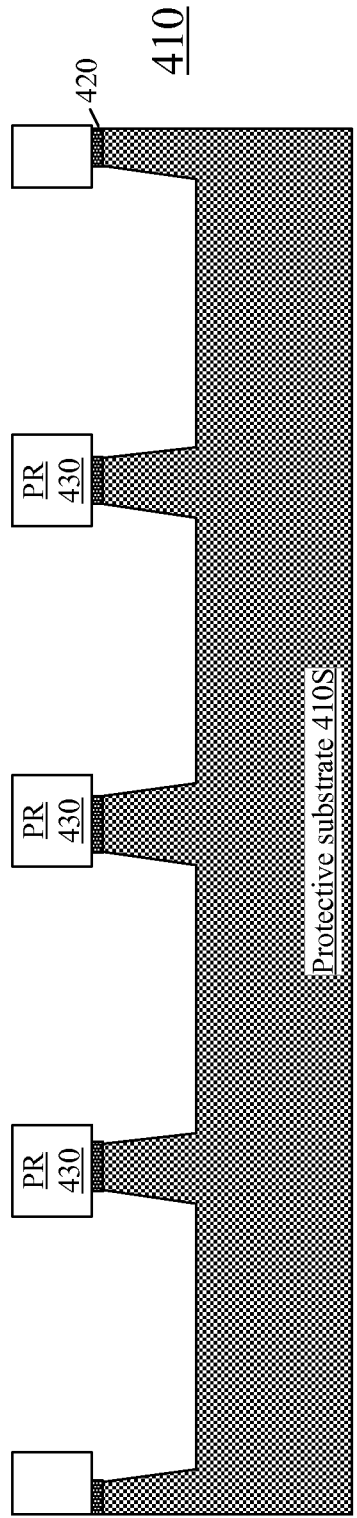
Figure 4C:
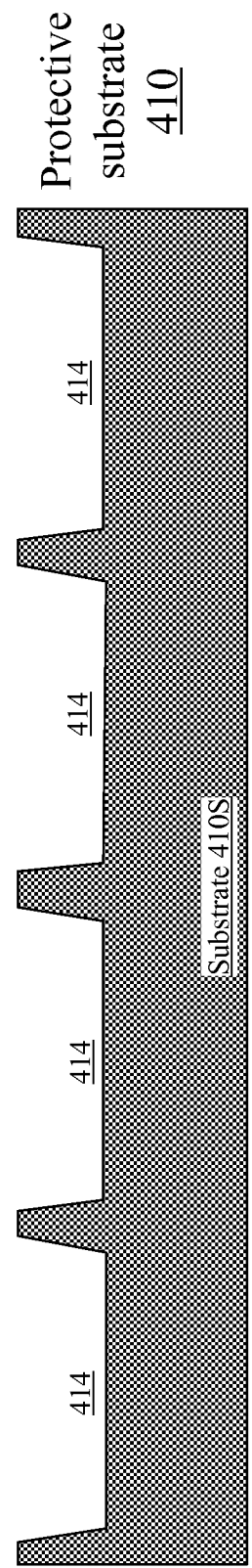

FIGS. 4A-4C illustrate fabrication of protective substrate 410. Many variations are possible. Substrate 410 should be sufficiently rigid to facilitate subsequent handling of the assembly as explained below. In the embodiment shown, substrate 410 includes monocrystalline silicon substrate 410S of a thickness 650 microns or higher. Other materials and thicknesses are possible, based on any factors that may be important (including the availability of materials and processes). One possible factor is reducing the mismatch of the coefficients of thermal expansion (CTE) between substrates 410 and 120.1S: if substrate 120.1S is silicon, then substrate 410S could be silicon or another material with a similar CTE. Another factor is reducing the CTE mismatch between substrate 410 and dies 110. In some embodiments, substrate 410S will not have any circuitry, but if circuitry is desired in or on substrate 410S then this may affect the choice of material. The circuitry can be fabricated before, and/or during, and/or after the steps described below.

Another possible factor is high thermal conductivity to enable the substrate 410 to act as a heat sink. For example, metal may be appropriate.

Cavities 414 (FIG. 4C) are formed in substrate 410 to match the size and position of dies 110. An exemplary process is as follows (this process is appropriate for a silicon substrate 410S, and may be inappropriate for other materials; known processes can be used for silicon or other materials). First, an auxiliary layer 420 (FIG. 4A) is formed to cover the substrate 410S for protection or for improved adhesion of subsequently formed photoresist 430. Resist 430 is deposited and patterned photolithographically to define the cavities. Auxiliary layer 420 exposed by the resist openings is etched away. Then substrate 410S is etched in these openings to form cavities 414 with sloped, upward-expanding sidewalls. The cavity depth depends on the thickness of dies 410 and connections 140.1 as explained below. Non-sloped (vertical) or retrograde sidewalls, or other sidewall profiles are also possible.

Then photoresist 430 is removed. In the example shown, auxiliary layer 420 is also removed, but in other embodiments layer 420 remains in the final structure.

As shown in FIG. 5A, substrate 410 is attached to interposer 120.1 so that each die 110 fits into a corresponding cavity 414. More particularly, legs 410L of protective substrate 410 are attached to the top surface of interposer 120.1 (e.g. to RDL 210.T if the RDL is present; legs 410L are those portion(s) of protective substrate 410 that surround the cavities). The substrate-to-interposer attachment is shown as direct bonding, but other types of attachments (e.g. by adhesive) can also be used as described further below. The entire assembly is marked with numeral 504.

In FIG. 5A, the dies' top surfaces physically contact the top surfaces of cavities 414. In some embodiments, each die's top surface is bonded to the cavity top surface (directly or in some other way, e.g. by adhesive). This bonding increases the bonding strength between the two substrates and improves the thermal conductivity of the thermal path from the dies to the protective substrate.

In other embodiments, the dies are not bonded to the cavities' top surfaces, and thus the dies' top surfaces can slide laterally along the cavities' top surfaces in thermal movement. This may reduce the thermal stresses, e.g. if the die-interposer CTE matching is better than the matching between the interposer and protective substrate 410.

As noted above, in some embodiments the dies are underfilled and/or encapsulated from above by a suitable stress-relieving material, e.g. epoxy. In case of encapsulation from above, the encapsulant may be a solid material (possibly thermosetting) physically contacting the top surfaces of cavities 414. The encapsulant may or may not be bonded to the cavity surfaces as described above, with benefits similar to those described above for the no-encapsulant embodiments.

To ensure physical contact between the dies (or the encapsulant) and the cavities, the top surfaces of the dies (or encapsulant) should have uniform height. To improve the height uniformity, the dies (or encapsulant) can be polished before joining of substrate 410 to interposer 120.1. Suitable polishing processes include lapping, grinding, and chemical mechanical polishing (CMP). Also, before inserting the dies into cavities, the cavity surfaces and/or the dies can be provided with a suitable temperature interface material (TIM, not shown here but shown at 525 in FIGS. 5E.2 and 5E.3 discussed below) to improve the thermal transfer between the dies and substrate 410. TIM's thermal conductivity can usually be higher than that of air. Exemplary TIMs are those that exist in semisolid, gel-like (grease-like) state throughout the range of expected operating temperatures (e.g. 0° C. to 200° C. for some assemblies) or at least when the temperatures are high to make die cooling particularly desirable (20° C. to 200° C. for some assemblies). The gel-like materials fill free spaces between the dies and substrate 410 to provide a thermally conductive path away from the dies. An exemplary TIM material is a thermal grease available from Arctic Silver, Inc. (having an office in California, USA); the grease's thermal conductivity is 1 W/mK.

After the bonding of substrate 410 to interposer 120.1, the interposer is thinned from the bottom to expose the metal 224M (FIG. 5B). The thinning involves partial removal of substrate 120.1S and dielectric 324 (if the dielectric is present). The thinning may be performed by known techniques (e.g. mechanical grinding or lapping of substrate 120.1S followed by dry or wet, masked or unmasked etch of substrate 120.1S and dielectric 324; the substrate and the dielectric are etched simultaneously in some embodiments.) In some embodiments, dielectric 324 protrudes out of substrate 120.1S around metal 224M at the end of the thinning operation, and metal 224M protrudes out of the dielectric. See for example the aforementioned U.S. Pat. No. 6,958, 285. As noted above, the invention is not limited to particular processes.

Advantageously, interposer 120.1 is kept flat by substrate 410, so the handling of the assembly 504 is facilitated. Substrate 410 also helps absorb and dissipate the heat generated during this and subsequent fabrication stages and in subsequent operation of assembly 504. The final thickness of substrate 120.1S can therefore be very low, e.g. 50 microns or even 5 microns or less. Hence, blind vias 224B (FIG. 3B) can be shallow. The shallow depth facilitates fabrication of the metallized vias (i.e. facilitates the via etch and subsequent deposition of dielectric and metal into the vias). The shallow depth also shortens the signal paths through the vias. Moreover, if the vias are shallow, each via can be narrower while still allowing reliable dielectric and metal deposition. The via pitch can therefore be reduced.

If desired, protective substrate 410 can be thinned from the top; this is not shown. The combined thickness of substrates 120.1S and 410 is defined by desired properties, such as rigidity, resistance to warpage, heat dissipation, and assembly size.

Figure 5C:
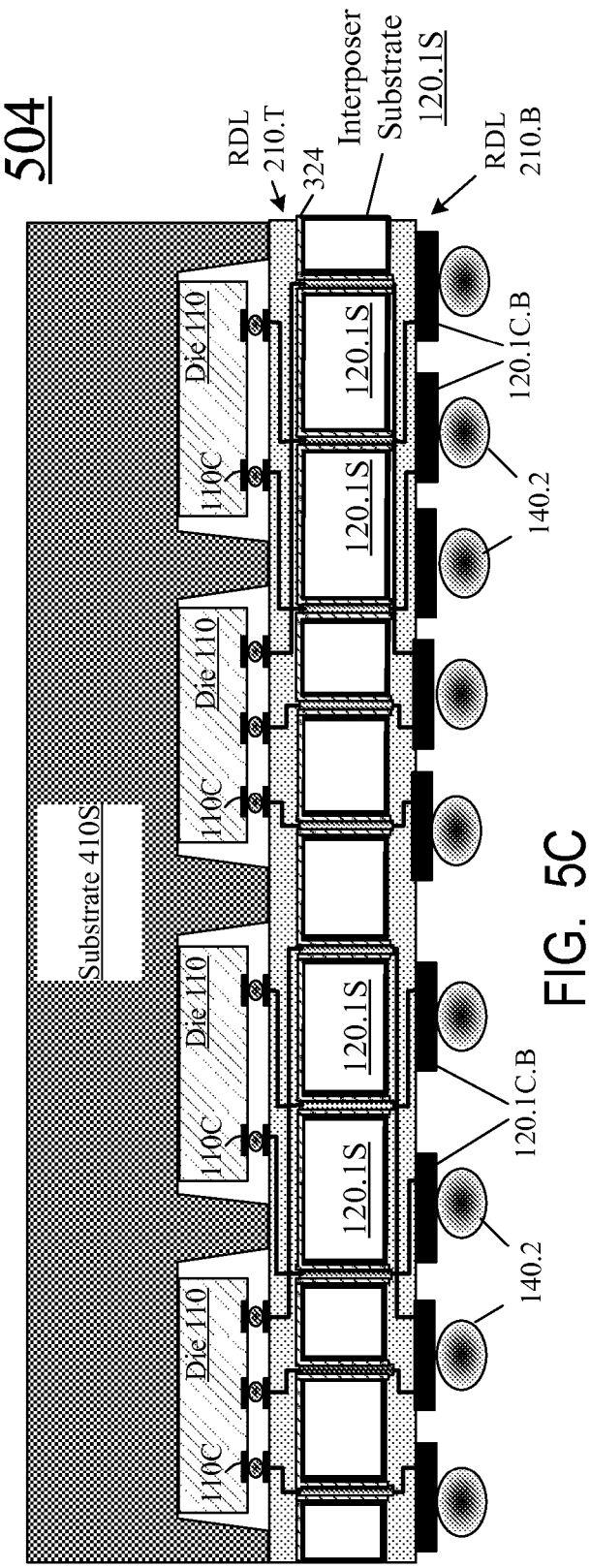

Subsequent process steps depend on the particular application. In some embodiments (FIG. 5C), RDL 210.B is formed on the bottom of substrate 120.1S, possibly using prior art techniques (as in FIG. 2 for example). The RDL provides contact pads 120.1C.B and connects them to metal 224M. (If the RDL is omitted, the contact pads are provided by metal 224M). If desired, the assembly 504 can be diced into stacks 504S (FIG. 5D). Then the stacks (or the entire assembly 504 if dicing is omitted) are attached to other structures, such as wiring substrate 120.2 (e.g. a printed wiring substrate) in FIG. 5E.1. In the example of FIG. 5E.1, a stack 504S is attached to PWS 120.2, and more particularly the stack's contacts 120.1C.B are attached to PWS contacts 120.2C, possibly by the same techniques as in FIG. 1 or 2. Conductive lines 130 of PWS 120.2 connect the contact pads 120.2C to each other or other elements. These details are not limiting.

FIG. 5E.2 shows a possible bottom view of the horizontal cross section along the line 5E.2-5E.2 in FIG. 5E.1. In the example of FIG. 5E.2, the dies are surrounded by temperature interface material (TIM) 525. The legs 410L form a region completely surrounding each die, and the interposer area bonded to the legs also completely surrounds each die.

FIG. 5E.3 shows another possible bottom view of the same horizontal cross section, also with TIM 525. In this example, the legs 410L are provided only on two opposite sides of each die (left and right sides) but are not provided above and below the dies. Each cavity 414 is a horizontal groove in substrate 410S, possibly containing multiple dies spread laterally along the groove. The groove may run through the entire substrate. Other cavity shapes are also possible.

As noted above, protective substrate 410 and interposer 120.1 can be bonded by adhesive, and FIG. 6 illustrates such bonding by adhesive 610. Adhesive 610 is provided on legs 410L or the corresponding areas of interposer 120.1 or both. The structure is shown at the stage of FIG. 5A (before interposer thinning). In some embodiments, the adhesive is elastic, with a low elasticity modulus (e.g. silicone rubber with elasticity modulus of 50 MPa), to help absorb the thermal expansion of dies 110 (so that the pressure from the expanding dies 110 would not damage the protective substrate 410 or the dies). In some embodiments, this is beneficial if the dies' CTE is equal to or greater than the CTE of protective substrate 410 or substrate 410S. The adhesive's elasticity also absorbs the height non-uniformity of the top surfaces of dies 110 or the top surfaces of cavities 414. Also, to absorb the dies expansion, the adhesive may have a CTE equal to or greater than the dies' CTE. Exemplary adhesives are epoxy-based underfills.

Figure 7:
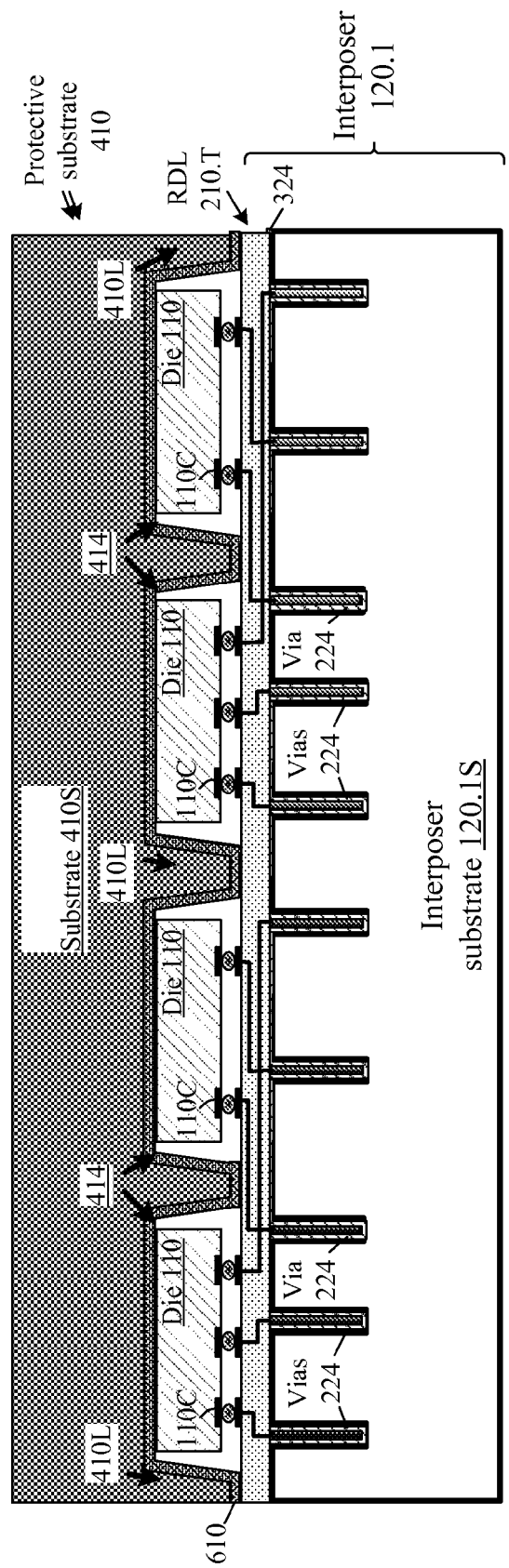

FIG. 7 shows a similar embodiment, but the adhesive 610 covers the whole bottom surface of protective substrate 410S. The adhesive bonds the dies' (or encapsulant's) top surfaces to the top surfaces of the cavities. The adhesive's CTE can be equal to, or greater than, or less than, the dies' CTE.

Figure 8A:
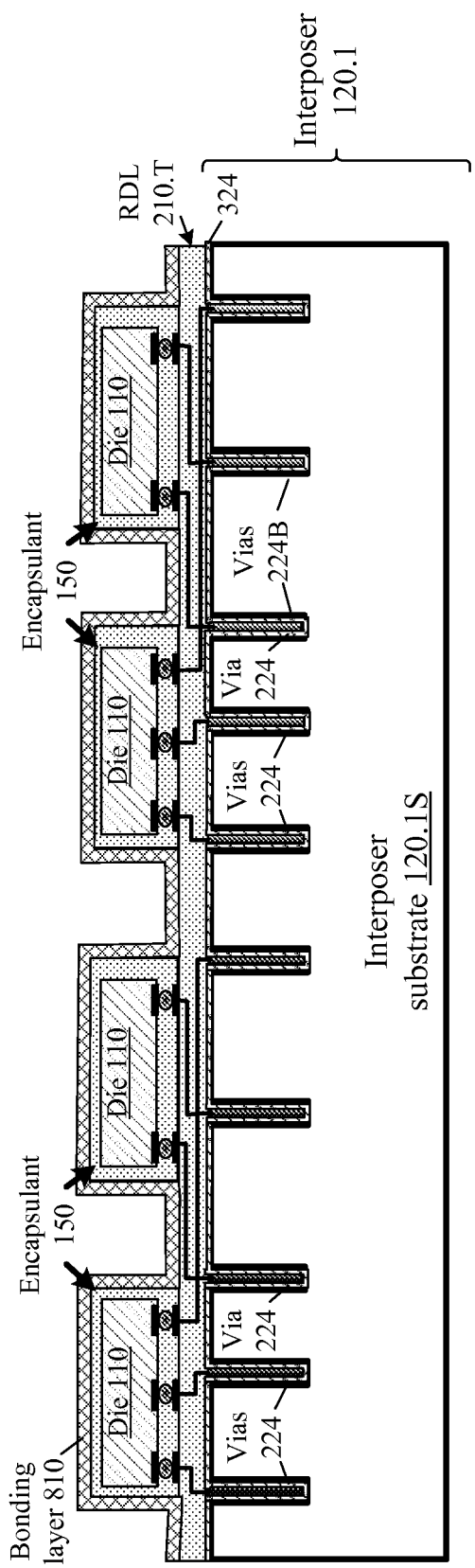
Figure 8B:
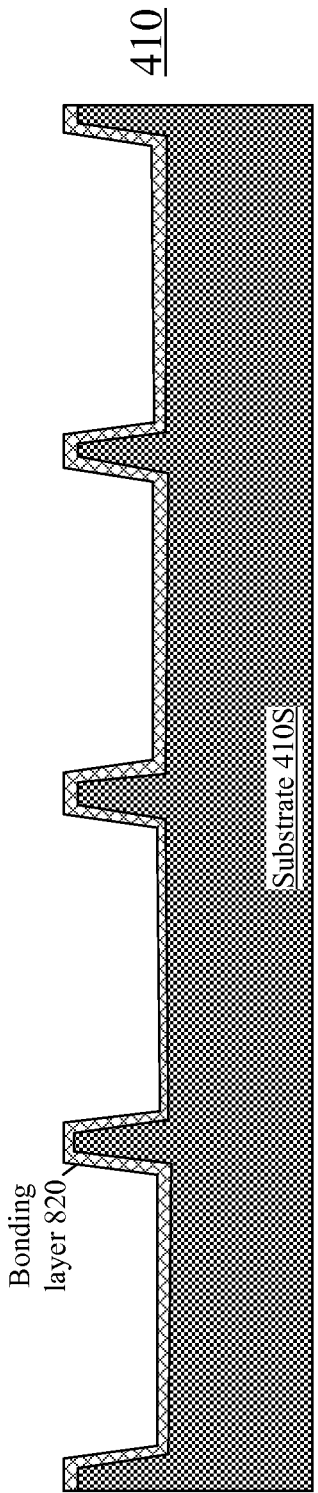
Figure 8C:
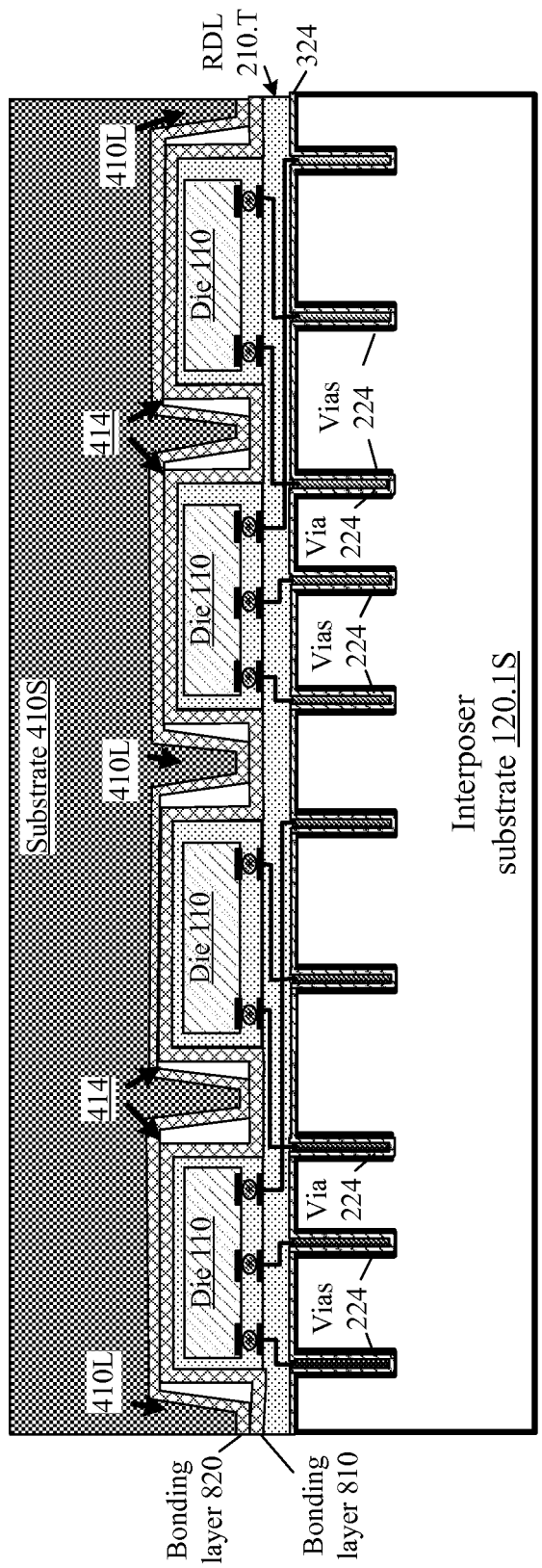
Figure 9A:
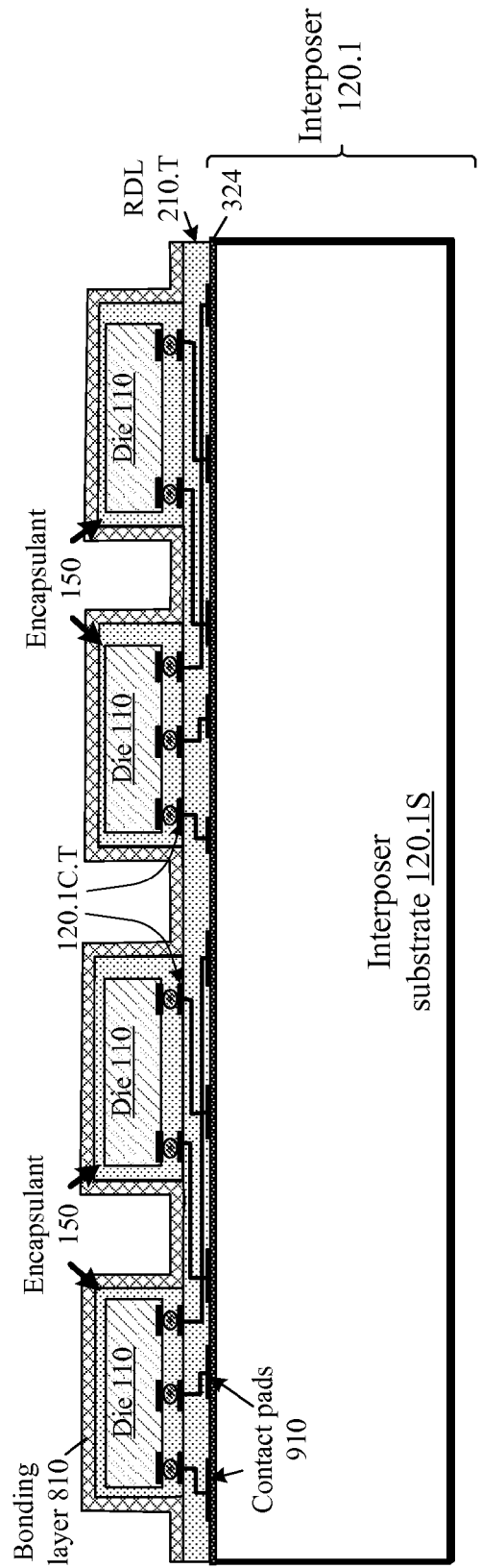
Figure 9B:
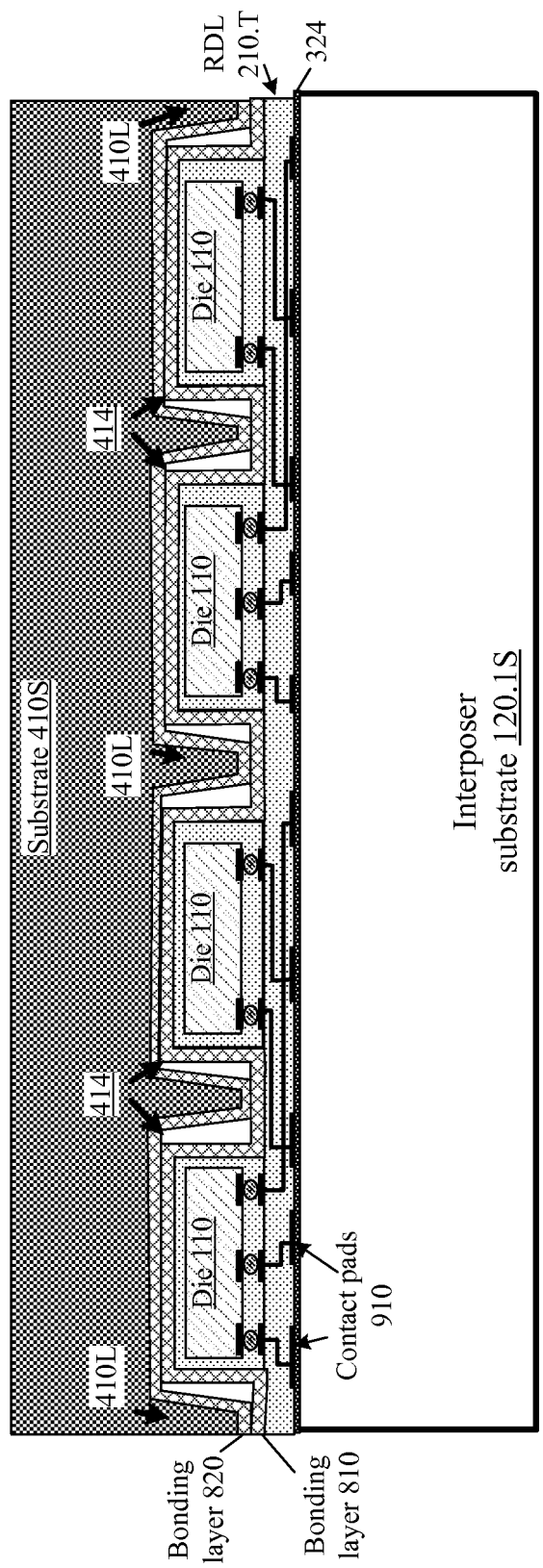

FIGS. 8A-8C illustrate the use of separate bonding layers 810, 820 to directly bond the protective substrate 410 to interposer 120.1. In some embodiments, the bonding layers are silicon dioxide, but other materials can also be used (e.g. metals for eutectic bonding). Referring to FIG. 8A, the dies are attached to interposer 120.1 as in FIG. 3E; the dies are then optionally underfilled and/or encapsulated from above (in FIG. 8A, encapsulant 150 encapsulates and underfills the dies). Bonding layer 810, e.g. silicon dioxide or metal, is formed to cover the interposer and the dies (and the encapsulant if present), by any suitable techniques (e.g. sputtering).

Referring to FIG. 8B, the protective substrate 410 is provided with cavities as in FIG. 4C. Then a bonding layer 820, e.g. silicon dioxide or metal, is formed to cover the substrate surface by any suitable techniques (e.g. sputtering, or thermal oxidation if substrate 410S is silicon).

Referring to FIG. 8C, the interposer is joined to substrate 410 so that the layers 810, 820 physically contact each other. The structure is then heated to bond the layer 820 to layer 810 where the two layers meet, i.e. at legs 410L and at the cavities' top surfaces. In some embodiments however, before the bonding, the layer 820 is removed at the cavities' top surfaces not to bond the dies to the cavities' top surfaces.

Subsequent processing of the structures of FIGS. 6-8A (interposer thinning, possible dicing, etc.) can be as described above for other embodiments.

The process step sequences described above are not limiting; for example, the vias 224 can be formed after the interposer thinning. FIGS. 9A-9D illustrate an exemplary process. Interposer 120.1 is fabricated essentially as in FIG. 3E or 6 or 8A, but without vias 224 (the vias will be formed later). In particular, dielectric 324 is a flat layer on interposer substrate 120.1S. Then contact pads 910 are formed on substrate 120.1S at the locations of future vias 224. RDL 210.T is optionally fabricated on top of the interposer to connect the contact pads 910 to pads 120.1C.T on top of the interposer. (Alternatively, the pads 120.1C.T can be provided by pads 910.) Dies 110 are attached to pads 120.1C.T, and optionally underfilled and encapsulated. Bonding layer 810 (as shown) is optionally deposited as in FIG. 8A for bonding to the protective substrate (alternatively, the bonding can be by an adhesive as in FIG. 6 or 7, or by a direct bonding process as described above in relation to FIG. 5A).

Interposer 120.1 with the dies attached is then bonded to protective substrate 410 (FIG. 9B) as in any embodiment described above. Then the interposer is thinned (FIG. 9C). The dies will be protected by substrate 410 during subsequent steps. Substrate 410 can be thinned at any desired stage.

Then metallized vias 224 are formed from the interposer bottom. An exemplary process is as follows:

1. Dielectric 920 (e.g. silicon dioxide or silicon nitride) is deposited (e.g. by sputtering or CVD) to cover the bottom surface of interposer substrate 120.1S.

2. Vias (through-holes) are etched from the bottom through dielectric 920 and substrate 120.1S. This is a masked etch which stops on contact pads 910.

3. Dielectric 930 (e.g. silicon dioxide or silicon nitride) is deposited (e.g. by sputtering or CVD) to cover the bottom surface of interposer substrate 120.1S and to line the vias. Dielectric 930 covers the contact pads 910 from the bottom.

4. Dielectric 930 is etched to expose the contact pads 910. This can be a masked etch. Alternatively, a blanket anisotropic (vertical) etch can be used to remove the dielectric 930 from over at least a portion of each contact pad 910 while leaving the dielectric on the via sidewalls. The vertical etch may or may not remove dielectric 930 outside the vias.

5. A conductive material 224M (e.g. metal) is formed in the vias, possibly by the same techniques as described above (e.g. copper electroplating). The conductive material is not present outside the vias (e.g. it can be polished away by CMP). The conductive material may fill the vias or just line the via surfaces. The conductive material in each via physically contacts the corresponding pad 910.

Subsequent processing steps can be as described above in connection with FIGS. 5C-5E.3. In particular, the bottom RDL 210.B (FIG. 5C) and connections 140.2 can be formed as described above. The structure can be diced if desired (FIG. 5D), and attached to another structure (e.g. PWS 120.2 in FIG. 5E.1).

Figure 10:
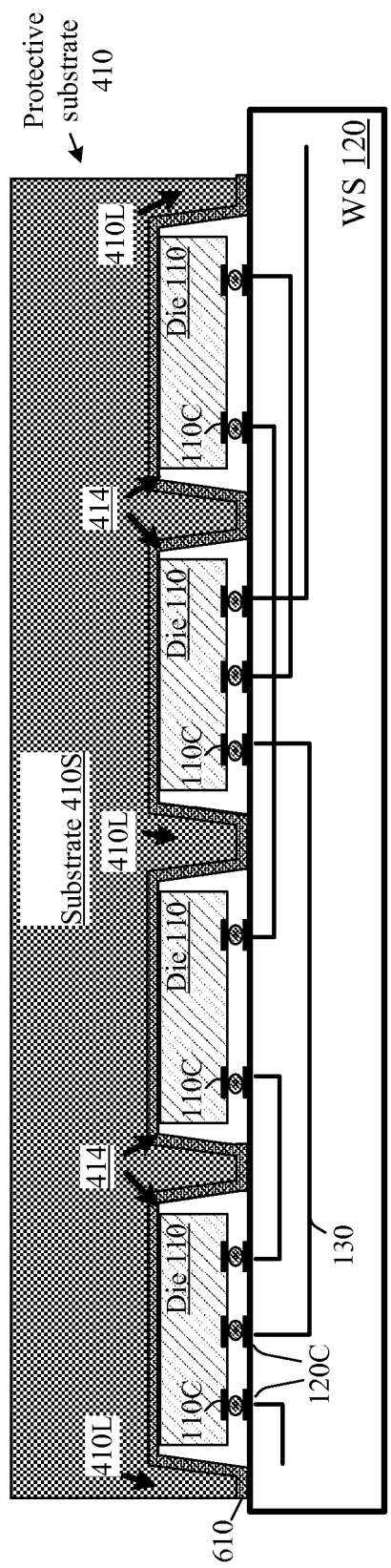

Vias 224 are optional, and further the substrate 120.1 can be any wiring substrate, such as shown at 120 in FIG. 10. This figure illustrates an embodiment using an adhesive 610 to bond the protective substrate 410 to WS 120 at legs 410L and at the cavity top surfaces, but any other bonding method described above can be used. No underfill or other encapsulant is shown, but underfill with or without encapsulation of the entire die can be present.

The techniques described above in connection with FIGS. 5A-10 can be used to attach any number of separate protective substrates 410 to the same interposer 120.1 or WS 120; different protective substrates 410 can be attached to the same side of a substrate 120.1 or 120, with different dies in different cavities of the same or different protective substrates 410. Other protective substrates 410 can be attached to the opposite side of substrate 120.1 or 120. Some of the dies may have no protective substrate 410 to protect them. Each substrate 120.1S or 410S can be a wafer, and the two substrates can be of the same size in a given assembly 504; but different sizes are also possible in the same assembly.

Figure 11:
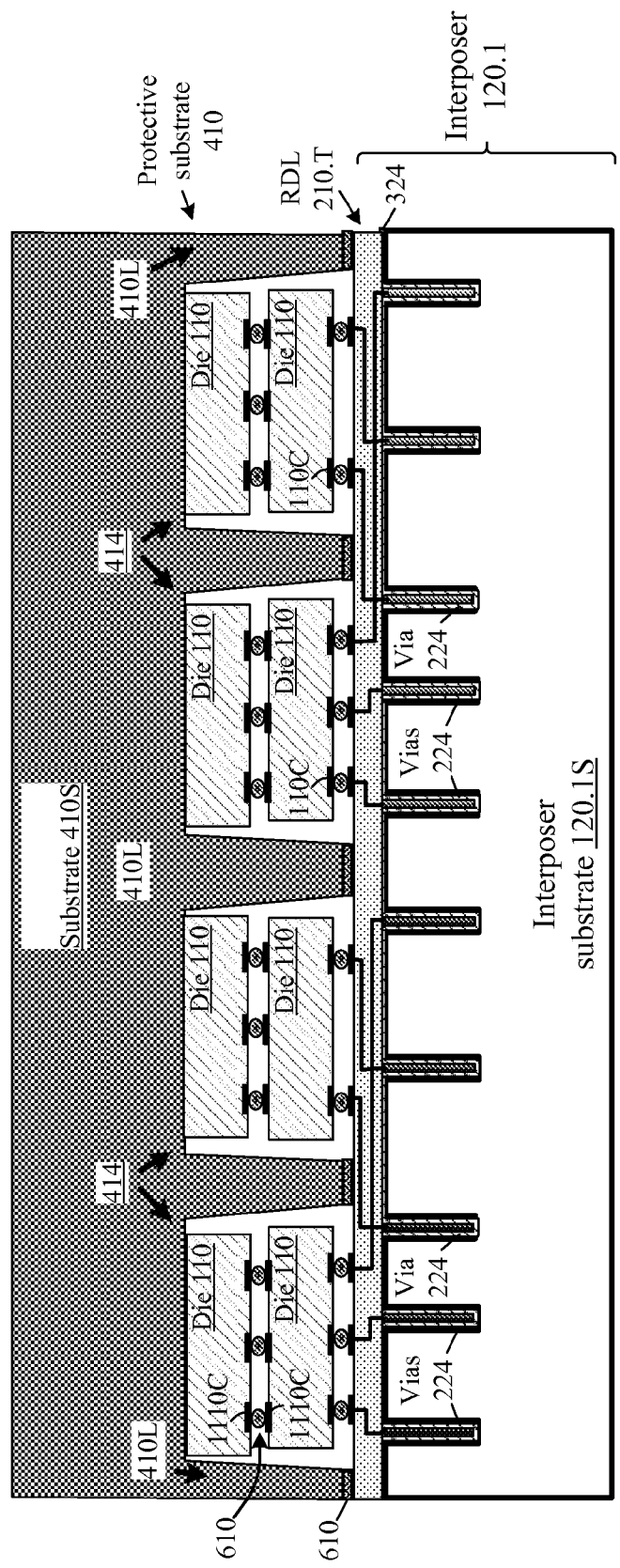

The dies can also be stacked one above another in the same cavity (see FIG. 11 showing the structure at the same fabrication stage as FIG. 6), with only the top die of each stack physically contacting the corresponding cavity's top surface. The dies in each stack may have their respective circuits interconnected through their contact pads 1110C and respective connections 140 (which can be of any type described above). In FIG. 11, substrates 120.1S, 410S are bonded together by adhesive 610 on legs 410L as in FIG. 6, but the other bonding methods described above can also be used. Stacked dies can also be used with other variations described above, e.g. when the protective substrate is bonded directly to the PWS.

Figure 12:
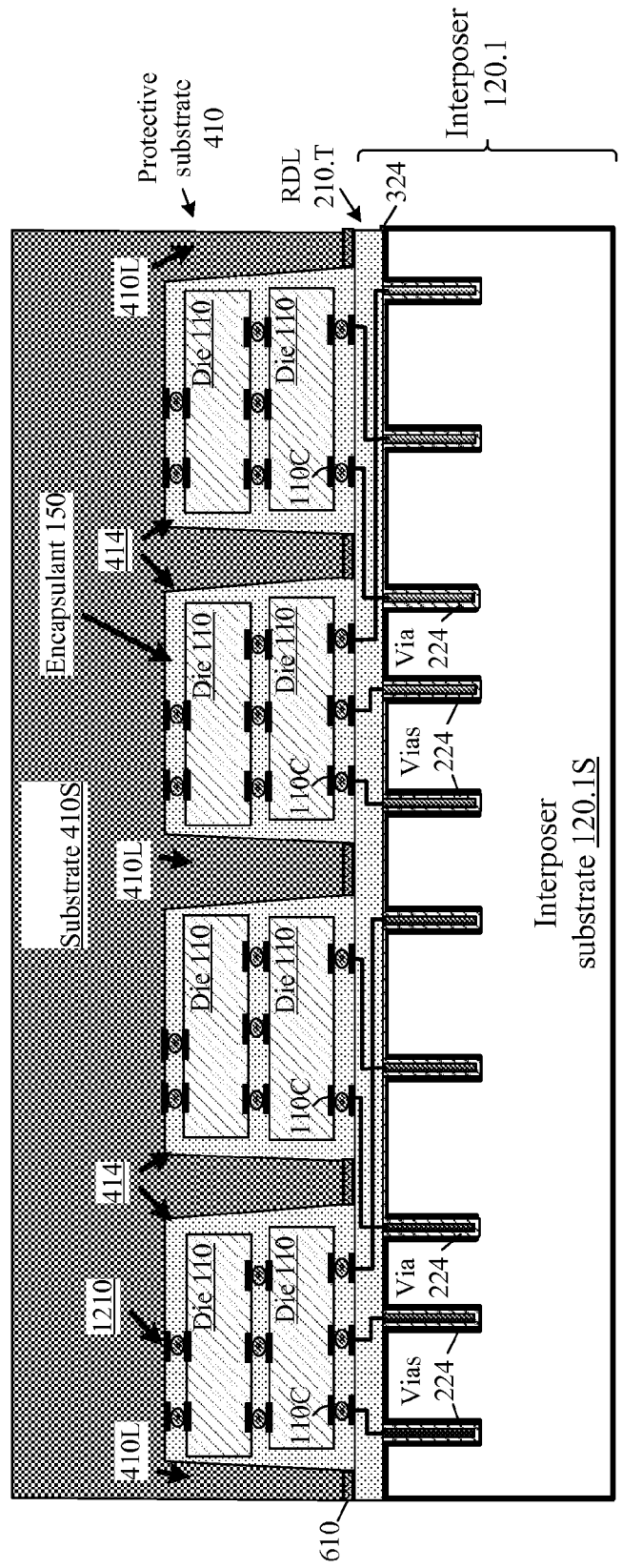

In some embodiments, substrate 410S has circuitry, possibly connected to the circuitry in the dies and/or the interposer 120.1S or the PWS. See FIG. 12, showing the top dies connected to substrate 410S by structures 1210; each structure 1210 includes a contact pad in substrate 410S, a corresponding contact pad on a top die 110, and a connection (e.g. solder or any other type described above) bonding the two contact pads to each other. In the example of FIG. 12, encapsulant 150 underfills and completely surrounds each die, contacting the cavities' top surfaces. As noted above, encapsulation and/or underfilling are optional.

The invention is not limited to the embodiments described above. For example, the vias 224 can be formed after the RDLs, and can be etched through one or both of the RDLs.

Some embodiments provide a manufacture comprising:

a first substrate (e.g. 120.1 or 120) comprising one or more first contact pads (e.g. the top pads 120.1C.T);

one or more dies attached to the first substrate, each die comprising a semiconductor integrated circuit which comprises one or more contact pads each of which is attached to a respective first contact pad;

a second substrate (e.g. 410 or 410S) comprising one or more cavities, the second substrate being attached to the first substrate, wherein at least part of each die is located in a corresponding cavity in the second substrate, the second substrate comprising a surface area (e.g. a surface of legs 410L) which lies outside of the cavities and is attached to the first substrate;

wherein at least at some temperature at which the structure is electrically operable, at least one die satisfies one or both of conditions (A) and (B):

(A) the die physically contacts a surface of the corresponding cavity;

(B) the die is separated from the surface of the corresponding cavity by solid material (e.g. an encapsulant or a bonding layer) which physically contacts the die and the surface of the corresponding cavity.

In some embodiments, in a side view in which each cavity is in a bottom surface of the second substrate (e.g. as in FIG. 5C or 5E.1), said surface area of the second substrate laterally surrounds each cavity (e.g. as in FIG. 5E.2).

In some embodiments, the at least one die is attached to the surface of the corresponding cavity.

In some embodiments, the at least one die is not attached to the surface of the corresponding cavity.

In some embodiments, the one or more first contact pads are located at a first side of the first substrate;

the first substrate comprises one or more second contact pads at a second side opposite to the first side (e.g. contact pads 120.1C.B at the interposer bottom); and the first substrate comprises one or more electrically conductive paths passing through the first substrate (e.g. metallized vias 224) and electrically connecting at least one first contact pad to at least one second contact pad.

In some embodiments, at least one of the conditions (A) and (B) is satisfied at room temperature.

In some embodiments, the at least one die is under pressure from the second substrate.

In some embodiments, the pressure does not exceed 200 MPa at room temperature. In some embodiments, the pressure is greater than the atmospheric pressure (1 bar, i.e. $10^5$ Pa), and can be in the range from 1 bar to 200 MPa or any sub-range of this range. The pressure can also be above or below this range.

Some embodiments provide a method for fabricating an electrically functioning manufacture, the method comprising:

obtaining a first substrate (e.g. 120.1) comprising a first side and one or more first contact pads at the first side;

attaching one or more dies to the first substrate, each die comprising a semiconductor integrated circuit which comprises one or more contact pads each of which is attached to a respective first contact pad;

obtaining a second substrate (e.g. 410) comprising one or more cavities;

attaching the second substrate to the first substrate, with at least part of each die being located in a corresponding cavity in the second substrate, the second substrate comprising a surface area (e.g. bottom areal of legs 410L) which lies outside of the cavities and is attached to the first substrate;

wherein at least at some temperature at which the structure is electrically operable, at least one die satisfies one or both of conditions (A) and (B):

(A) the die physically contacts a surface of the corresponding cavity;

(B) the die is separated from the surface of the corresponding cavity by solid material which physically contacts the die and the surface of the corresponding cavity.

In some embodiments, in a side view in which each cavity is in a bottom surface of the second substrate, said surface area of the second substrate laterally surrounds each cavity.

In some embodiments, the at least one die is attached to the surface of the corresponding cavity.

In some embodiments, the at least one die is not attached to the surface of the corresponding cavity.

In some embodiments, the one or more first contact pads are located at a first side of the first substrate;

the first substrate comprises one or more second contact pads at a second side opposite to the first side; and the first substrate comprises one or more electrically conductive paths passing through the first substrate and electrically connecting at least one first contact pad to at least one second contact pad.

In some embodiments, at least one of the conditions (A) and (B) is satisfied at room temperature.

In some embodiments, the at least one die is under pressure from the second substrate when the first substrate is attached to the second substrate.

In some embodiments, the pressure does not exceed 200 MPa at room temperature.

In some embodiments, the one or more dies are a plurality of dies, and the method further comprises polishing a solid surface at a first side of the dies before attaching the first substrate to the second substrate, the first side of the dies being a side opposite to each die's one or more contact pads, the solid surface being a surface of the dies or of an encapsulant formed on the dies.

In some embodiments, the solid surface is a surface of the encapsulant which comprises an epoxy.

Some embodiments provide a manufacture comprising:
a first substrate comprising one or more first contact pads;
one or more dies attached to the first substrate, each die comprising a semiconductor integrated circuit which comprises one or more contact pads each of which is attached to a respective first contact pad;
a second substrate comprising one or more cavities, the second substrate being attached to the first substrate, wherein at least part of each die is located in a corresponding cavity in the second substrate, the second substrate comprising a surface area which lies outside of the cavities and is attached to the first substrate;
wherein at least at some temperature at which the structure is electrically operable, at least one die is under pressure from the second substrate.

In some embodiments, the pressure does not exceed 200 MPa at room temperature.

In some embodiments, in a side view in which each cavity is in a bottom surface of the second substrate, said surface area of the second substrate laterally surrounds each cavity.

In some embodiments, the at least one die is attached to the surface of the corresponding cavity.

In some embodiments, wherein the at least one die is not attached to the surface of the corresponding cavity.

In some embodiments, wherein the one or more first contact pads are located at a first side of the first substrate;
the first substrate comprises one or more second contact pads at a second side opposite to the first side; and
the first substrate comprises one or more electrically conductive paths passing through the first substrate and electrically connecting at least one first contact pad to at least one second contact pad.

Other embodiments and variations are within the scope of the invention, as defined by the appended claims.

The invention claimed is:

1. A method for fabricating an electrically functioning apparatus, the method comprising:
(a) obtaining an assembly comprising:
a first substrate;
one or more modules attached and electrically connected to the first substrate, each module protruding from a top side of the assembly and comprising one or more semiconductor integrated circuits;
(b) forming a first layer on the top side of the assembly, the first layer comprising a top surface of a first material, the top surface overlying one or more first protrusions formed by the one or more modules and comprising a second protrusion over each first protrusion, the top surface comprising a laterally-extending area located at a level below a top of each second protrusion;
(c) obtaining a second substrate comprising one or more cavities; and
(d) after said forming the first layer on the top side of the assembly, bonding the second substrate to the top surface of the first layer, with at least part of each semiconductor integrated circuit being located in a corresponding cavity in the second substrate, a portion of the top surface of the first layer being bonded to a surface of a corresponding cavity in the second substrate, and a portion of the top surface of the first layer being bonded to the second substrate at said laterally-extending area, at least one said laterally-extending area extending outside the corresponding cavity;
wherein said bonding comprises directly bonding the first layer to the second substrate; and
wherein at a conclusion of said bonding, part of the top surface of the first layer is not bonded to the second substrate and is spaced from the second substrate.

2. The method of claim 1 wherein said bonding the second substrate comprises bonding the first layer to the second substrate in an area outside the one or more cavities.

3. The method of claim 2 wherein said bonding the second substrate comprises bonding the first layer to the second substrate around each said cavity.

4. The method of claim 1 wherein the first layer covers each module.

5. The method of claim 1 wherein, for each module, the first layer covers the module and an area adjacent to the module and laterally surrounding the module.

6. The method of claim 1 wherein the first layer covers the assembly.

7. The method of claim 6 wherein an entire top surface of the first layer is continuous.

8. The method of claim 1 wherein the first layer is inorganic.

9. The method of claim 1 wherein the first layer is silicon oxide.

10. The method of claim 1 wherein the first layer is metal.

11. The method of claim 1 wherein the second substrate comprises:
a constituent substrate of a selected material, the one or more cavities extending into the constituent substrate; and
a second layer of a material different from the selected material, the second layer extending into the one or more cavities; and
said bonding comprises directly bonding the first layer to the second layer.

12. The method of claim 1 wherein said part of the top surface of the first layer underlies a surface of at least one said cavity in the second substrate.

13. The method of claim 11 wherein at a conclusion of said bonding, part of the top surface of the first layer is not bonded to the second layer and is spaced from the second layer.

14. The method of claim 13 wherein said part of the top surface of the first layer underlies a surface of at least one said cavity in the second substrate.

15. A method for fabricating an electrically functioning apparatus, the method comprising:
(a) obtaining an assembly comprising:
a first substrate;

one or more modules attached and electrically connected to the first substrate, each module protruding from a top side of the assembly and comprising one or more semiconductor integrated circuits;

(b) forming a continuous first layer on the top side of the assembly, the first layer comprising a top surface of a first material, the top surface overlying one or more first protrusions formed by the one or more modules and comprising a second protrusion over each first protrusion;

(c) obtaining a second substrate comprising one or more cavities; and (d) after said forming the first layer on the top side of the assembly, bonding the second substrate to the top surface of the first layer, with at least part of each semiconductor integrated circuit being located in a corresponding cavity in the second substrate, and a top of each second protrusion of the top surface of the first layer being bonded to a surface of a corresponding cavity in the second substrate, wherein the first layer extends outside of at least one cavity;

wherein the top surface comprises, for each second protrusion, a first area adjacent to the second protrusion and not bonded to the second substrate, the area being farther from the second substrate than is the second protrusion.

16. The method of claim 15 wherein the top surface further comprises, for each second protrusion, a second area separated from the second protrusion by the first area; and the second substrate is directly bonded to the top surface of the first layer at the top of each second protrusion and at each second area.

17. A method for fabricating an electrically functioning apparatus, the method comprising:

(a) obtaining an assembly comprising:

a first substrate;

one or more modules attached and electrically connected to the first substrate, each module protruding from a top side of the assembly and comprising one or more semiconductor integrated circuits;

(b) forming a continuous first layer on the top side of the assembly, the first layer comprising a top surface of a first material, the top surface overlying one or more first protrusions formed by the one or more modules and comprising a second protrusion over each first protrusion;

(c) obtaining a second substrate comprising one or more cavities, the second substrate comprising:

a constituent substrate of a selected material, the one or more cavities extending into the constituent substrate; and a second layer of a material different from the selected material, the second layer comprising a bottom surface extending into the one or more cavities; and (d) after said forming the first layer on the top side of the assembly, bonding the bottom surface of the second layer to the top surface of the first layer, with at least part of each semiconductor integrated circuit being located in a corresponding cavity in the second substrate, and at least a portion of each second protrusion of the top surface of the first layer being bonded to the bottom surface of the second layer in a corresponding cavity in the second substrate, and with at least part of the top surface of the first layer in the corresponding cavity not being bonded to the second layer and being farther from the second layer than a top of the second protrusion.

* * * * *